United States Patent
Urabe et al.

(10) Patent No.: US 10,483,763 B2
(45) Date of Patent: Nov. 19, 2019

(54) PHOTOVOLTAIC DEVICE AND OPERATING POINT CONTROL CIRCUIT DEVICE FOR PHOTOVOLTAIC CELLS OR OTHER POWER SUPPLY ELEMENTS CONNECTED IN SERIES

(71) Applicants: Toyota Jidosha Kabushiki Kaisha, Toyota-shi Aichi-ken (JP); Tokyo Metropolitan University, Tokyo (JP)

(72) Inventors: Shinichi Urabe, Shizuoka-ken (JP); Toshihisa Shimizu, Fuchu (JP)

(73) Assignees: Toyota Jidosha Kabushiki Kaisha, Toyota-shi, Aichi-ken (JP); Tokyo Metropolitan University, Tokyo (JP)

( * ) Notice: Subject to any disclaimer, the term of this patent is extended or adjusted under 35 U.S.C. 154(b) by 134 days.

(21) Appl. No.: 15/674,226

(22) Filed: Aug. 10, 2017

(65) Prior Publication Data
US 2018/0062392 A1    Mar. 1, 2018

(30) Foreign Application Priority Data

Aug. 25, 2016 (JP) .................. 2016-164789
Apr. 6, 2017 (JP) .................. 2017-076077

(51) Int. Cl.
*H02J 3/38* (2006.01)
*H01L 31/05* (2014.01)

(52) U.S. Cl.
CPC .......... *H02J 3/385* (2013.01); *H01L 31/0504* (2013.01); *H02J 3/387* (2013.01); *Y02B 10/14* (2013.01); *Y02E 10/58* (2013.01)

(58) Field of Classification Search
CPC .......... H02S 40/34; H02S 40/36; H02S 40/00; H02J 3/38; H02J 7/35; H02J 7/0063;
(Continued)

(56) References Cited

U.S. PATENT DOCUMENTS

2015/0144176 A1* 5/2015 Chang ............... H02J 3/383
136/244
2015/0270709 A1* 9/2015 Abu Qahouq .... H01L 31/02021
307/29

(Continued)

FOREIGN PATENT DOCUMENTS

JP        2016214061 A     12/2016

OTHER PUBLICATIONS

Shimizu, Toshihisa, "Generation Control Circuitry for Operating Point Normalization of Photovoltaic Modules", FB Technical News No. 56, Nov. 1, 2000, pp. 22-27.
(Continued)

*Primary Examiner* — Fritz M Fleming
*Assistant Examiner* — Jagdeep S Dhillon
(74) *Attorney, Agent, or Firm* — Dinsmore & Shohl LLP

(57) ABSTRACT

In a photovoltaic device or an operating point control circuit in which a current is output from a corresponding power supply cell or capacitor to between output terminals by periodically cutting off switching elements which are connected in series to a plurality of power supply cells and/or capacitors connected in series between the output terminals via inductors, cutoff duty ratios of all the switching elements are uniformly fixed to the same value in one cycle in which all the switching elements are cut off once.

18 Claims, 13 Drawing Sheets

(58) Field of Classification Search
CPC .. H02J 1/00; H02J 1/108; H01L 31/05; H01L 31/0504; H02M 7/44; H02M 7/797; H02M 7/5387; H02M 3/155; H02M 3/04; H02M 1/08; H02M 1/42
USPC ............... 307/78, 76, 80, 82, 83, 64, 66
See application file for complete search history.

(56) References Cited

U.S. PATENT DOCUMENTS

| | | | |
|---|---|---|---|
| 2016/0261206 A1* | 9/2016 | Ayai | H02M 3/04 |
| 2016/0268890 A1* | 9/2016 | Ayai | H02M 3/156 |
| 2016/0322931 A1* | 11/2016 | Urabe | H02S 40/34 |
| 2017/0179768 A1* | 6/2017 | Jurok | H02J 7/0042 |
| 2018/0019688 A1* | 1/2018 | Wang | H02M 7/797 |

OTHER PUBLICATIONS

"Solar/Wind Energy Lecture Papers", 1996, pp. 57-60.
Shimizu, Toshihisa et al., "Generation Control Circuit for Photovoltaic Modules", IEEE Transactions on Power Electronics, vol. 16, No. 3, May 2001, pp. 293-300.

* cited by examiner

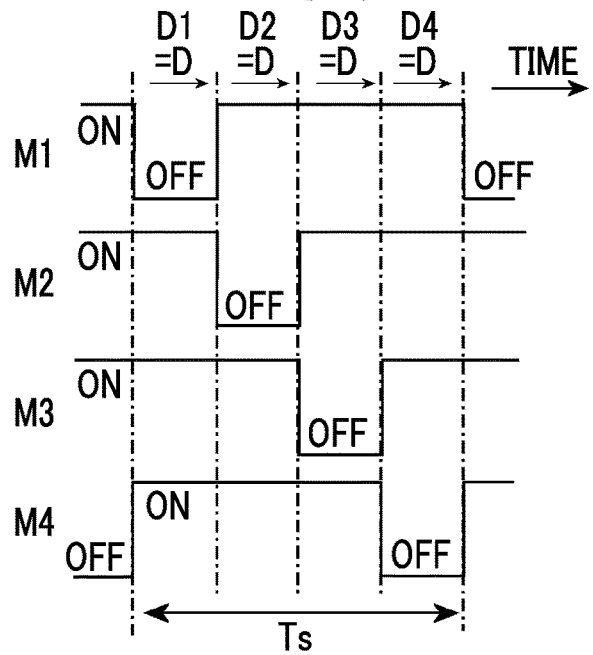
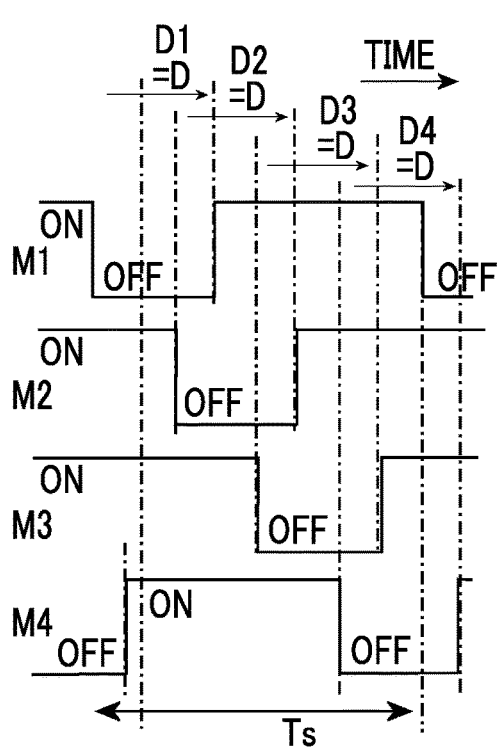
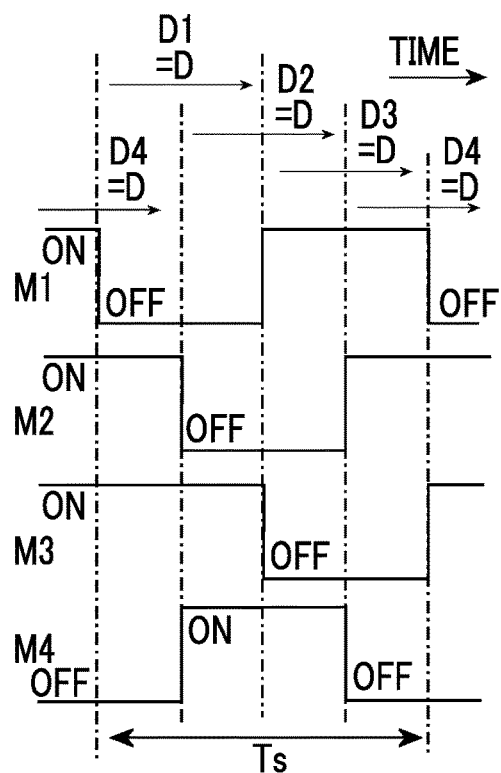

PHOTOVOLTAIC DEVICE AND OPERATING POINT CONTROL CIRCUIT DEVICE FOR PHOTOVOLTAIC CELLS OR OTHER POWER SUPPLY ELEMENTS CONNECTED IN SERIES

CROSS-REFERENCE TO RELATED APPLICATIONS

This application claims priority to Japanese Patent Application No. 2016-164789 filed on Aug. 25, 2016 and Japanese Patent Application No. 2017-076077 filed on Apr. 6, 2017, each of which is incorporated herein by reference in its entirety.

BACKGROUND

1. Technical Field

The disclosure relates to a photovoltaic device in which a plurality of photovoltaic cells are connected in series or a power output device in which other power supply cells (such as cells, capacitors, fuel cells, generators, or thermoelectric elements) are connected in series and more particularly to a circuit device (an operating point control circuit device) that controls operating points of photovoltaic cells or other power supply elements which are connected in series.

2. Description of Related Art

A voltage generated from one photovoltaic cell is generally lower than operating voltages of various mechanical mechanisms or chargers. As one method using photovoltaic cells for operation of such mechanical mechanisms or charging of such chargers, a configuration (a photovoltaic module) in which a plurality of photovoltaic cells are connected in series is employed for a photovoltaic system. In such a photovoltaic module, there is a likelihood that shadows will be formed on some cells due to deviations in installation angles of the photovoltaic cells or buildings. When unevenness in an amount of light received occurs between cells due to an influence of shadows on the cells or the like, a cell having a small amount of power generated may serve as a resistor (a reverse-biased diode), which may reduce an output of the photovoltaic module.

More specifically, referring to FIG. 1, a photovoltaic cell receiving a certain amount of light has generated voltage-current characteristics that a current (thin solid lines $I_{100}$ to $I_{25}$) decreases slowly until a generated voltage thereof increases from 0 V to a certain value and the current decreases rapidly when the generated voltage further increases. Accordingly, the generated power (thick solid lines $P_{100}$ to $P_{25}$) of the photovoltaic cell exhibits characteristics in which the generated power varies in a mountain shape with respect to the generated voltage, and there is an optimal operating point (a maximum power point or an optimal operating point) at which the magnitude of the generated power is a maximum. As illustrated in the drawing, when the amount of light received by the photovoltaic cell decreases (R=100%→R=25%), the generated voltage-current characteristics vary in a direction in which the current decreases ($I_{100}$→$I_{25}$) with respect to the generated voltage, and thus the generated power decreases ($P_{100}$→$P_{25}$) and the maximum power point also varies. In a circuit configuration in which a plurality of photovoltaic cells having such characteristics are simply connected in series, a common current flows in all the photovoltaic cells and the amounts of light received by all the photovoltaic cells are substantially the same. When the maximum power points thereof substantially match, the currents at the maximum power points are the same and all the photovoltaic cells can operate at the maximum power points. However, when the amounts of light received by some photovoltaic cells in a photovoltaic module decrease due to a shadow or the like, the same common current as in the cells having a large amount of light received flows in the photovoltaic cells of which the amounts of light received have decreased, the operating points thereof depart from the maximum power points, and the amounts of power generated thereof decrease by a larger degree than that corresponding to the decrease in the amount of light received. In addition, since the photovoltaic cells of which the amounts of light received have decreased serve as a resistor for the current, a further power decrease of the photovoltaic module is caused (that is, the maximum generated power corresponding to the amount of light received by the photovoltaic module cannot be obtained and a power output loss is also caused).

Therefore, as a device that can avoid a power decrease due to unevenness in the amount of light received between photovoltaic cells in such a photovoltaic module, a photovoltaic operating point control circuit device that can individually control operating points of the photovoltaic cells connected in series has been proposed (Toshihisa SHIMIZU and six others, pages 57-60, Solar/Wind Energy Lecture Papers, 1996, Toshihisa SHIMIZU, pages 22-27, FB Technical News No. 56, Nov. 1, 2000, and Toshihisa SHIMIZU and three others, pages 293-300, "Generation Control Circuit for Photovoltaic Modules" IEEE TRANSACTIONS ON POWER ELECTRONICS, VOL. 16, NO. 3, May, 2001). Such a photovoltaic operating point control circuit device uses a multistage step-up/down chopper circuit for a circuit configuration in which a plurality of photovoltaic cells are connected in series. Accordingly, a generated voltage can be controlled for each photovoltaic cell such that different currents flow therein. As a result, even when amounts of light received by a plurality of photovoltaic cells connected in series are different, the generated voltages can be adjusted such that currents flow at maximum power points of the photovoltaic cells and it is thus possible to cause all the photovoltaic cells to generate power substantially at maximum power points. That is, according to this photovoltaic operating point control circuit device, since even a photovoltaic cell of which an amount of light received has decreased due to a shadow can be made to operate at the maximum power point thereof, it is possible to obtain substantially the maximum generated power corresponding to an amount of light received by a photovoltaic module as a whole. Since a photovoltaic cell of which the amount of light received has decreased does not serve as a reverse-biased diode, it is also possible to avoid a power output loss.

SUMMARY

In a photovoltaic module in which a plurality of photovoltaic cells are connected in series, when it is intended to optimally control photovoltaic operating points of the photovoltaic cells using the above-mentioned photovoltaic operating point control circuit device, certain time and labor is required for retrieving the photovoltaic operating points. In such a photovoltaic operating point control circuit device, specifically, an operation of adjusting ratios between durations (duty ratios) of ON/OFF (connection/cutoff) of switching elements which are connected in parallel with the photovoltaic cells connected in series between output terminals and stepping up/down generated voltages (operating voltages) of the photovoltaic cells is performed. For example, when two operations of stepping up and stepping down a generated voltage for each of n photovoltaic cells connected in series are performed k times to retrieve a photovoltaic operating point, 2nk times of retrieval in total are required. Accordingly, as the number of photovoltaic cells increases, a time required for retrieval control of photovoltaic operating points to track variations in an amount of light received by the photovoltaic cells increases.

Referring to FIG. 1 again, when the amounts of light received by the photovoltaic cells decrease (R=100% to 25%) as described above, the characteristics vary in a direction in which the generated power ($P_{100}$ to $P_{25}$) decrease with respect to the generated voltage and the maximum power points (x) change as indicated by dotted lines in the drawing to correspond thereto. In the variation of the characteristics with respect to the decrease in the amount of light received, it can be ascertained that the power values ($P_{100}$ to $P_{25}$) and the current values ($I_{100}$ to $I_{25}$) vary greatly, but a variation width of the voltage values (x) of the maximum power points is relatively small and a variation of the generated power value with respect to the variation of the voltage value in the vicinity of the maximum power point in the generated power characteristics for each amount of light received is relatively slow. More specifically, for example, when there is a photovoltaic cell of which the amount of light received R has decreased from 100% to 75%, 50%, and 25% as illustrated in the drawing, it can be understood that decreases of the generated power ($P_{75}$, $P_{50}$, and $P_{25}$) with respect to the power at the maximum power point of each photovoltaic cell are about ΔP1, ΔP2, and ΔP3 as illustrated in the drawing, which can be understood not to be relatively large, even when all the generated voltages thereof are adjusted to the generated voltage (an alternate dashed and dotted line: $V_{mpp100}$) at the maximum power points of the photovoltaic cells (R=100%) of which the amount of light received is a maximum. That is, in a photovoltaic module, when the generated voltages of all the photovoltaic cells are fixed to a certain value, for example, the generated voltage value ($V_{mpp100}$) of the maximum power point of the photovoltaic cell having a maximum amount of light received, rather than an operation of adjusting the generated power and/or the generated voltage being performed such that each photovoltaic cell performs a photovoltaic operation at the maximum power point thereof to track a variation in the amount of light received by the photovoltaic cell, a slight power output loss may be generated but the time and labor required for adjusting the generated power and/or the generated voltage of each photovoltaic cell can be reduced, which is advantages. The generated voltage of each photovoltaic cell is determined by a duty ratio of the switching element connected in parallel thereto and a voltage between the output terminals of the photovoltaic module. Accordingly, even when the duty ratio of the switching element is set to a fixed value, the generated voltage of each photovoltaic cell can be adjusted as described above by adjusting the voltage between the output terminals.

According to an aspect of the disclosure, in a photovoltaic module in which a plurality of photovoltaic cells are connected in series, a photovoltaic device or a photovoltaic operating point control circuit device that can greatly reduce the time and labor required for adjusting a generated power and/or a generated voltage of each photovoltaic cell or adjusting a duty ratio of a switching element is provided. The "photovoltaic operating point control circuit device" refers to a device including circuit parts (such as connection terminals to photovoltaic cells, switching elements, capacitors, and inductors) for controlling the generated voltage and current of each of the photovoltaic cells connected in series. The "photovoltaic device" refers to a device having a configuration including the photovoltaic module including a plurality of photovoltaic cells connected in series and the photovoltaic operating point control circuit device.

Some embodiments are configured such that photovoltaic operation control of photovoltaic cells of the photovoltaic module using the photovoltaic device or the photovoltaic operating point control circuit device is more stable or cause less loss. Therefore, the disclosure may also provide a configuration for a photovoltaic device or photovoltaic operating point control circuit device that can operate more stably and/or with a less loss.

A circuit configuration of a device according to the disclosure which will be described in more detail later is not limited to photovoltaic cells, and can be used for control of operating voltages of power supply elements in a module in which power supply elements (such as chemical cells, fuel cells, capacitors, generators, and thermoelectric elements) outputting arbitrary power are connected in series. Accordingly, the disclosure may also provide a configuration capable of greatly reducing the time and labor required for adjusting the operating power and/or operating voltages of power supply elements in an operating point control circuit device that controls operating points of individual power supply elements (cells) in a module in which a plurality of photovoltaic cells and/or power supply elements (such as battery cells, capacitor cells, generators, and thermoelectric elements) are connected in series.

One aspect of the disclosure provides a photovoltaic device including a plurality of photovoltaic cells which are connected in series between output terminals or a plurality of photovoltaic cells and capacitors which are connected in series between output terminals; a photovoltaic operating point control circuit device including an inductor and a switching element that are connected in series to each photovoltaic cell or each photovoltaic cell and capacitor, the photovoltaic operating point control circuit device being configured to output a current from the corresponding photovoltaic cell or capacitor to between the output terminals by periodically cutting off the switching elements, wherein the photovoltaic operating point control circuit device fixes a cutoff duty ratios of all switching elements in one cycle in which the switching elements corresponding all the plurality of photovoltaic cells or the plurality of photovoltaic cells and capacitors are cut off once.

That is, in the device, the photovoltaic operating point control circuit device includes: a pair of output terminals; a plurality of electrode connection terminals that are connected to electrode terminals of the plurality of photovoltaic cells connected in series between the pair of output terminals; a capacitor that is connected in parallel to each of the plurality of photovoltaic cells via the corresponding electrode connection terminal between the pair of output terminals; a switching element that is connected in parallel to each of the plurality of photovoltaic cells via the corresponding electrode connection terminal and an inductor between the pair of output terminals and that selectively connects a pair of electrode connection terminals connected to each other; and a controller that alternately switches a state of each switching element between a connected state in which a pair of electrode connection terminals or terminals of a pair of capacitors are connected and a cut-off state in which a connection of both terminals is cut off in the same predetermined period. Regarding control of a series of switching elements, the controller normally performs control such that at least a part of the switching elements are in the cut-off state and the other switching elements are in the connected state, and ratios (cutoff duty ratios) of a duration of the cut-off state to the predetermined period in all the switching elements are uniformly fixed to the same value. The photovoltaic operating point control circuit device may have a configuration in which an additional capacitor is connected in series to the corresponding capacitor between the electrode connection terminal at one end of the plurality of photovoltaic cells connected in series and one of the output terminals or between two electrode connection terminals of two neighboring photovoltaic cells among the plurality of photovoltaic cells connected in series between the pair of output terminals and an additional switching element is connected in parallel to the additional capacitor and in series to the switching element, or a configuration in which an additional capacitor is connected in series to the capacitors connected in series between the pair of output terminals and an additional switching element is connected in parallel to the additional capacitor and in series to the switching elements connected in series between the pair of output terminals. In this case, control of the switching elements may be performed in the same way as described above to include the additional switching element and/or another additional switching element.

In brief, the device according to the disclosure has, as a circuit configuration, the same basic configuration as a photovoltaic operating point control circuit device for a plurality of photovoltaic cells connected in series using a multistage step-up/down chopper circuit, which is described in Toshihisa SHIMIZU and six others, pages 57-60, Solar/Wind Energy Lecture Papers, 1996, Toshihisa SHIMIZU, pages 22-27, FB Technical News No. 56, Nov. 1, 2000, and Toshihisa SHIMIZU and three others, pages 293-300, "Generation Control Circuit for Photovoltaic Modules" IEEE TRANSACTIONS ON POWER ELECTRONICS, VOL. 16, NO. 3, May, 2001, as can be understood from the description below with reference to the drawing. As described above, a circuit part in which an additional capacitor and an additional switching element are connected in parallel may be added between one end of the multistage step-up/down chopper circuit (a circuit including photovoltaic cells, capacitors, inductors, and switching elements) and one output terminal or between stages of the multistage step-up/down chopper circuit, or a circuit part in which an additional capacitor and an additional switching element are connected in parallel may be added outside of the pair of output terminals (in this case, plainly speaking, the circuit configuration is the same as a configuration in which one photovoltaic cell is removed from the photovoltaic operating point control circuit device described in Toshihisa SHIMIZU and six others, pages 57-60, Solar/Wind Energy Lecture Papers, 1996, Toshihisa SHIMIZU, pages 22-27, FB Technical News No. 56, Nov. 1, 2000, and Toshihisa SHIMIZU and three others, pages 293-300, "Generation Control Circuit for Photovoltaic Modules" IEEE TRANSACTIONS ON POWER ELECTRONICS, VOL. 16, NO. 3, May, 2001). In the multistage step-up/down chopper circuit, the cutoff duty ratio of the switching element in each stage of the step-up/down chopper circuit is adjusted such that the generated voltage of the corresponding photovoltaic cell is a desired voltage (in some embodiments, a voltage at a maximum power point) or a voltage across the corresponding capacitor is a desired voltage in the related art as described above. This adjustment operation requires much time and labor.

On the other hand, in the device according to the disclosure, in brief, the cutoff duty ratio of the switching element in each stage of the step-up/down chopper circuit is uniformly fixed. Accordingly, it is not necessary to perform an operation for adjusting the cutoff duty ratios and to greatly reduce the time and labor required for adjusting operating conditions of the device (as will be described in detail later, in order to enhance generated power efficiency, it is necessary to adjust an output voltage of the multistage step-up/down chopper circuit as a whole (a voltage between the output terminals)). In this configuration, as will be described in detail later, since the voltage applied in each stage of the multistage step-up/down chopper circuit, that is, the generated voltage of the corresponding photovoltaic cell (which includes a held voltage of an additional capacitor when the additional capacitor is provided), are basically non-uniformly determined to have certain values, the operating point of each photovoltaic cell can depart from the maximum power point depending on an amount of light received by each photovoltaic cell. However, in the multistage step-up/down chopper circuit, a current flowing in each stage is individually determined based on the generated voltage-current characteristics depending on the amount of light received by each photovoltaic cell and a variation range of the generated power due to a variation of the generated voltage with respect to a variation of the amount of light received by each photovoltaic cell is small. Accordingly, a decrease of the generated power due to departure of the generated voltage from the maximum power point is minimized and is small. That is, according to the above-mentioned configuration, the advantages that it is possible to keep a range of decrease of generated power relatively small and to reduce the time and labor required for adjusting operating conditions of the device are achieved.

As described above, the configuration according to the disclosure is not limited to the photovoltaic cells, but can be applied to control of operating voltages of power supply cells in a module in which power supply elements outputting arbitrary power such as chemical cells, fuel cells, capacitors, generators, or thermoelectric elements (hereinafter referred to as "power supply cells") are connected in series. Accordingly, another aspect of the disclosure provides an operating point control circuit device for a plurality of power supply cells which are connected in series, including: a pair of output terminals; a plurality of electrode connection terminals that are connected to electrode terminals of the plurality of power supply cells connected in series between the pair of output terminals; a capacitor that is connected in parallel to each of the plurality of power supply cells via the corresponding electrode connection terminal between the pair of output terminals; a switching element that is connected in parallel to each of the plurality of power supply cells via the corresponding electrode connection terminal and an inductor between the pair of output terminals and that selectively connects a pair of electrode connection terminals connected to each other; and a controller that alternately switches a state of each switching element between a connected state in which a pair of electrode connection terminals or terminals of a pair of capacitors are connected and a cut-off state in which a connection of both terminals is cut off in the same predetermined period, wherein the controller normally performs control such that at least a part of the switching elements are in the cut-off state and the other switching elements are in the connected state, and ratios of a duration of the cut-off state to the predetermined period in all the switching elements are uniformly fixed to the same value. In this configuration, an additional capacitor may be connected in series to the corresponding capacitor between the electrode connection terminal at one end of the plurality of power supply cells connected in series and one of the output terminals or between two electrode connection terminals of two neighboring power supply cells among the plurality of power supply cells connected in series between the pair of output terminals, and an additional switching element may be connected in parallel to the additional capacitor and in series to the switching element. Alternatively, in this configuration, an additional capacitor may be connected in series to the capacitors connected in parallel to the additional capacitor and in series between the pair of output terminals, and an additional switching element may be connected in series to the switching elements connected in series between the pair of output terminals. Hereinafter, unless otherwise mentioned, a "power supply cell" refers to a photovoltaic cell or a power supply element that outputs arbitrary power.

Regarding switching control of connection/cutoff of the switching elements in the above-mentioned device according to the disclosure, in one aspect, cutoff times of all the switching elements in one cycle may be set not to overlap each other. That is, the controller may control states of the switching elements such that times at which all the switching elements are switched to the cut-off state are different from each other. In this configuration of the device according to the disclosure, operating voltages in the stages of the step-up/down chopper circuit (that is, generated voltages, operating voltages, or held voltages of the photovoltaic cells, the power supply cells, or the capacitors connected in series thereto) are uniformly determined to be one value by uniformly fixing the cutoff duty ratios. In this configuration, since the cutoff duty ratio is a reciprocal of the number of stages of the step-up/down chopper circuit, that is, the number of switching elements connected in series (which includes an additional switching element and another additional switching element when the additional switching elements are present), the cutoff duty ratio is simply adjusted. In this configuration, in brief, since the switching elements are cut off one at a time, it is possible to stably determine the operating voltages in the stages of the step-up/down chopper circuit corresponding to the switching elements.

Regarding switching control of connected/cut-off states of the switching elements in the above-mentioned device according to the disclosure, in another aspect, a sum of cutoff durations of all the switching elements in one cycle is larger than a duration of one cycle, and a part of the cutoff times may overlap in the neighboring cutoff times. That is, the controller may control states of the switching elements such that the switching elements which are switched to the cut-off state at a time are two neighboring switching elements. According to this configuration, voltages which are applied to the switching elements in the cut-off state can decrease and thus a withstanding voltage level required for the switching elements can decrease, which is advantageous, in comparison with a configuration in which the states of the switching elements are controlled such that the times at which all the switching elements are switched to the cut-off state are different from each other. In this case, in the embodiments, the controller may control the states of the switching elements such that the switching elements which are switched to the cut-off state at a time among the switching elements are two neighboring switching elements and the switching element switched to the cut-off state sequentially shifts one at a time from one end of an array of the switching elements connected in series to the other end. According to this configuration, as will be described later, in the switching element which is early in the cut-off state, flow of a current in only one direction is allowed due to presence of a parasitic diode and thus substantially only one switching element is switched to the cut-off state at a time. Since this is substantially the same as a configuration in which the switching elements are cut off one at a time, it is possible to stably determine the operating voltages in the stages of the step-up/down chopper circuit corresponding to the switching elements.

Regarding switching control of connected/cut-off states of the switching elements in the above-mentioned device according to the disclosure, in another aspect, a certain plurality of cutoff times among the cutoff times of all the switching elements in one cycle may be set to the same. More specifically, the controller may perform control of alternately switching states of the switching elements connected in series between a first phase in which all the switching elements which are odd-numbered from one end of an array of the switching elements connected in series are in the cut-off state and all the switching elements which are even-numbered from the one end of the array of the switching elements are in the connected state and a second phase in which the switching elements which are odd-numbered from the one end of the array of the switching elements are in the connected state and the switching elements which are even-numbered from the one end of the array of the switching elements are in the cut-off state. In this case, since the states of the switching elements are switched between the first phase and the second phase, the cutoff duty ratios are determined to be ½ and thus the time and labor required for adjusting the cutoff duty ratios can be reduced. As will be described in detail later, since a plurality of switching elements are switched to the cut-off state at the same time, withstanding voltages required for the switching elements can be reduced, which is advantageous.

Particularly, when the states are alternately switched between two phases including the "first phase" and the "second phase" as described above in the switching control of the connected/cut-off states of the switching elements, in some embodiments, the operating point control circuit device may employ a configuration in which a voltage stabilization capacitor is connected in parallel to both ends of each set (such as a set of the first and second switching elements, a set of the third and fourth switching elements, . . . ) of the switching elements which are $(2m-1)$-th and $2m$-th (where m is an integer from 1 to $n/2$) disposed from one end of an array of n (where n is a positive integer) switching elements connected in series and a voltage stabilization capacitor is connected in parallel to both ends of each set (such as a set of the second and third switching elements, a set of the fourth and fifth switching elements, . . . ) of the switching elements which are $(2i-2)$-th and $(2i-1)$-th (where i is an integer from 2 to $n/2$) disposed from the one end. As will be described in detail later, when the "voltage stabilization capacitor" is used, an advantage that the operating voltage of each photovoltaic cell or each power supply cell is further stabilized is obtained.

In an embodiment of the operating point control circuit according to the disclosure, a connection point between the switching elements which are $(2m-1)$-th and $2m$-th (where m is an integer from 1 to $n/2$) disposed from one end of an array of n (where n is a positive integer) switching elements connected in series and a connection point between the capacitors corresponding to the switching elements may be connected via the inductor, and a connection point between the switching elements which are (2i−2)-th and (2i−1)-th (where i is an integer from 2 to n/2) disposed from the one end and a connection point between the capacitors corresponding to the switching elements may be connected without an inductor interposed therebetween. That is, as can be more easily understood later with reference to the accompanying drawings, in a control configuration in which the connected/cut-off states of the switching elements are alternately switched between two phases including the "first phase" and the "second phase," an inductor is not necessarily disposed (may be disposed) between the connection point between the (2i−2)-th (where i is an integer from 2 to n/2) switching element and the (2i−1)-th switching element from one end and the connection point between the capacitors corresponding to the switching elements and thus an inductor has only to be disposed every other in a series of wires connecting the switching elements and the capacitors. An inductor has parasitic resistance larger than that in a normal conductive wire (for example, a straight copper wire). Accordingly, when the number of inductors used decreases, a further decrease in power output loss can be expected by as much.

When a circuit part in which an additional capacitor and an additional switching element are connected in parallel is additionally connected to the step-up/down chopper circuit connected to the photovoltaic cells connected in series and the circuit part is connected between the output terminals, there is a period in which an output current flowing between the output terminals flows into the additional switching element and a power output loss due to the switching element is caused by as much. On the other hand, in a configuration in which the additional capacitor and the additional switching element are disposed outside the output terminals (in which another additional capacitor and another additional switching element are connected), the output current does not flow in the additional switching element and thus the power output loss therein decreases greatly. The added circuit part may be provided for the purpose of stepping up the voltage between the output terminals as will be described later (see Japanese Patent Application Publication No. 2016-214061 (JP 2016-214061 A)). Therefore, when the circuit part in which an additional capacitor and an additional switching element are connected in parallel and which is added to the step-up/down chopper circuit is used, the circuit part is added to the outside of the output terminals when emphasis is put on a decrease in power output loss, and may be added to the inside of the output terminals when emphasis is put on step-up of a voltage between the output terminals.

In the device according to the disclosure, as described above, the voltages in the stages of the step-up/down chopper circuit are determined depending on the cutoff duty ratios of the corresponding switching element and the voltage between output terminals, and the sum of the generated voltages or the operating voltages of the power supply cells in the stages interposed between the output terminals (the sum including a held voltage of an additional capacitor (when the additional capacitor is provided) is equal to the voltage between the output terminals. As will be described later, since the duty ratios are uniformly fixed, the generated voltages, the operating voltages, or the held voltages of the power supply cells or the capacitors become equal to each other and is a function of the voltage between output terminals.

Therefore, the voltage between output terminals may be typically controlled by a voltage controller or an output voltage controller, or the generated voltages, the operating voltages, or the held voltages of the power supply cells or the capacitors in the stages interposed between the output terminals may be adjusted by adjusting the voltage between output terminals. For example, when photovoltaic cells are used as the power supply cells connected in series, the voltage between output terminals may be adjusted such that the generated voltage of a certain photovoltaic cell or a photovoltaic cell having a maximum amount of light received is the voltage at the maximum operating point. Accordingly, there is a likelihood that the generated voltages of the other photovoltaic cells are equal to the generated voltage of the photovoltaic cell having a maximum amount of light received and will be deviated from the voltage at the maximum operating point depending on the amount of light received, but this voltage deviation is relatively small and thus the power decrease is expected to be relatively small. In a case of photovoltaic cells, the voltage control may be performed using a voltage or current controller such as a maximum power point tracking (MPPT) controller that performs MPPT. A voltage controller for changing the voltage between output terminals which has been adjusted as described above to be equal to a required voltage of a load connected thereto may be connected between the output terminals. Accordingly, it is possible to drive or operate a load while causing the power supply cells to operate in an optimal state as much as possible.

In the device according to an embodiment of the disclosure, the switching control of connected/cut-off states of the switching elements is performed with a series of switching elements as a unit. However, in another embodiment, a plurality of photovoltaic cells or a plurality of photovoltaic cells and capacitors may be grouped into a plurality of units, and a photovoltaic operating point control circuit device may be provided individually for each of the plurality of units and each thereof may control cutoff of the switching elements belonging to the corresponding unit. That is, a plurality of switching elements may be grouped into a plurality of groups and states of the switching elements belonging to the plurality of groups may be controlled individually for each group. When the number of photovoltaic cells or power supply cells is large and thus the number of stages of the step-up/down chopper circuit is large, it may be advantageous that a series of switching elements are grouped into a plurality of units and are individually controlled instead of controlling a series of switching elements as one unit. In this case, the plurality of photovoltaic cells or the plurality of photovoltaic cells and capacitors may be grouped into a plurality of units sharing one at a boundary therebetween, and the photovoltaic operating point control circuit device may be provided for each of the plurality of units and may control cutoff of the switching elements belonging to the corresponding unit. That is, between a pair of output terminals, at least one power supply cell may be connected in parallel to both one switching element in a first group and one switching element in a second group.

In the configuration according to the disclosure, in the device that controls the generated voltages of a plurality of photovoltaic cells connected in series using a multistage step-up/down chopper circuit, the time and labor for adjusting the duty ratios of the switching elements is not required and it is thus possible to greatly reduce the time and labor for adjusting the generated power and/or the generated voltages of the photovoltaic cells, by fixing cutoff duty ratios of all switching elements in one cycle in which the switching elements corresponding to all the plurality of photovoltaic cells or the plurality of photovoltaic cells and capacitors are cut off once, that is, by uniformly fixing ratios of a period in the cut-off state to a predetermined cycle (cutoff duty ratios) of all the switching elements to the same. According to this configuration, for example, when it is intended to increase the power of the photovoltaic module as large as possible, the voltage between output terminals has only to be adjusted such that the output power is a maximum with the cutoff duty ratios fixed. In this case, as described above, it may be difficult to cause all the photovoltaic cells to generate power at the maximum power points due to differences in an amount of light received or the like, but a difference in generated voltage at the maximum power points of the photovoltaic cells due to the difference in the amount of light received is relatively small and thus a decrease in generated power is expected not to be relatively large, and an advantage that adjustment is more rapidly performed is obtained. It will be understood that the same advantage is also obtained when arbitrary power supply cells other than the photovoltaic cells are connected in series to operate.

In the device according to the disclosure, in the configuration in which states of the switching elements are alternately switched between two phases of the "first phase" and the "second phase" regarding the switching control of the connected/cut-off states of the switching elements, the cutoff duty ratio can be always set to 0.5. In this case, the switching elements can be very easily controlled, which is advantageous. In this regard, according to the configuration in which the above-mentioned "voltage stabilization capacitors" are added to the above-mentioned configuration, it is possible to stabilize the generated voltages or the operating voltages of the photovoltaic cells or the power supply cells by only adding a relatively simple configuration, which is advantageous.

Other objects and advantages of the disclosure will be apparent from the following description of exemplary embodiments of the disclosure.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 3A is a diagram illustrating exemplary timing chart of ON/OFF states of switching elements which can be employed in the circuit configurations illustrated in FIGS. 2A and 2B and an example in which times at which the switching elements are switched to the OFF state are different from each other (an example in which the switching elements are switched to the OFF state one at a time);

FIG. 3B is a diagram illustrating exemplary timing chart of ON/OFF states of switching elements which can be employed in the circuit configurations illustrated in FIGS. 2A and 2B and an example in which a part of times at which the switching elements are switched to the OFF state overlap (an example in which a sum of cutoff durations of all the switching elements in one cycle is larger than the duration of one cycle and a part of cutoff times overlap in the neighboring cutoff periods);

FIG. 3C is a diagram illustrating exemplary timing chart of ON/OFF states of switching elements which can be employed in the circuit configurations illustrated in FIGS. 2A and 2B and an example in which two neighboring switching elements are simultaneously switched to the OFF state and the switching element which is switched to the OFF state shifts from one end to the other end;

Figure 5A:
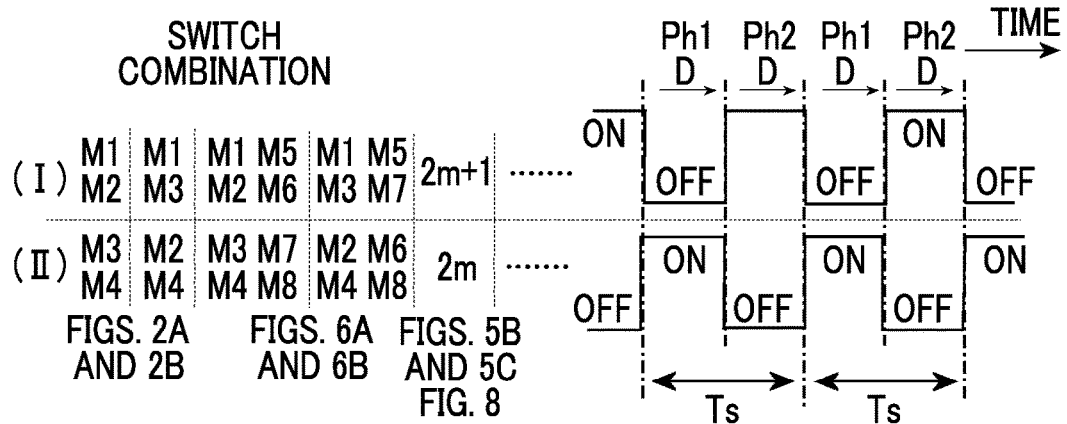
Figure 5B:
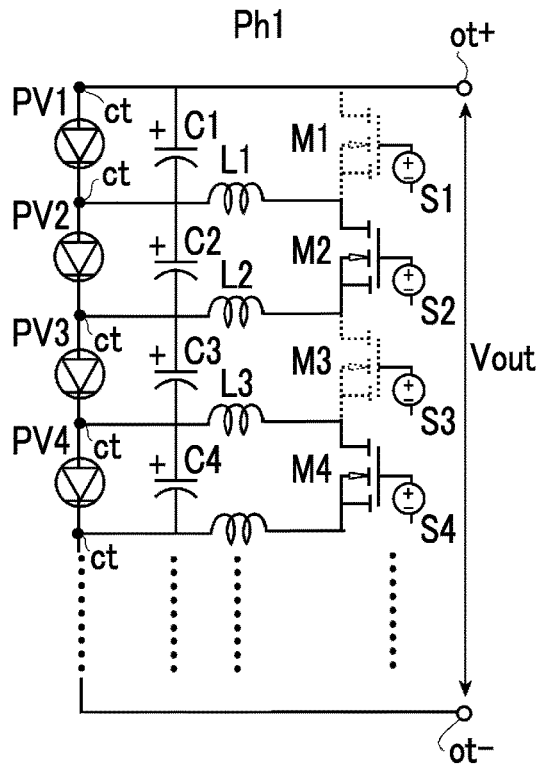
Figure 5C:
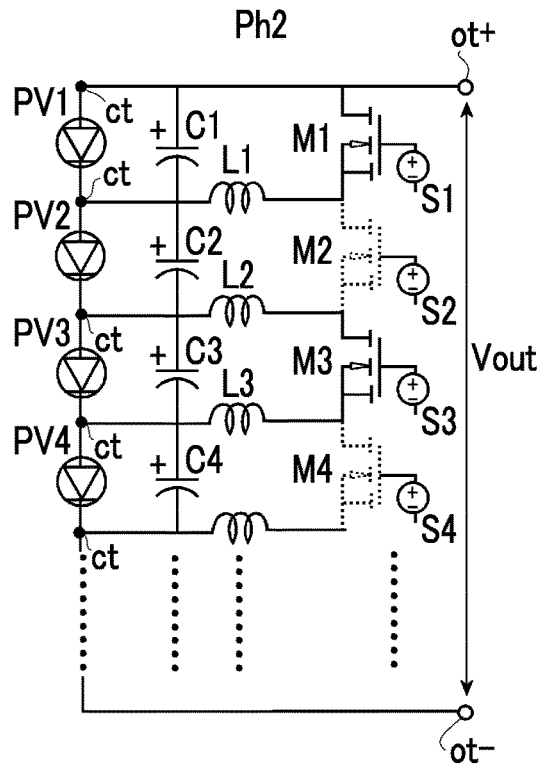
Figure 6A:
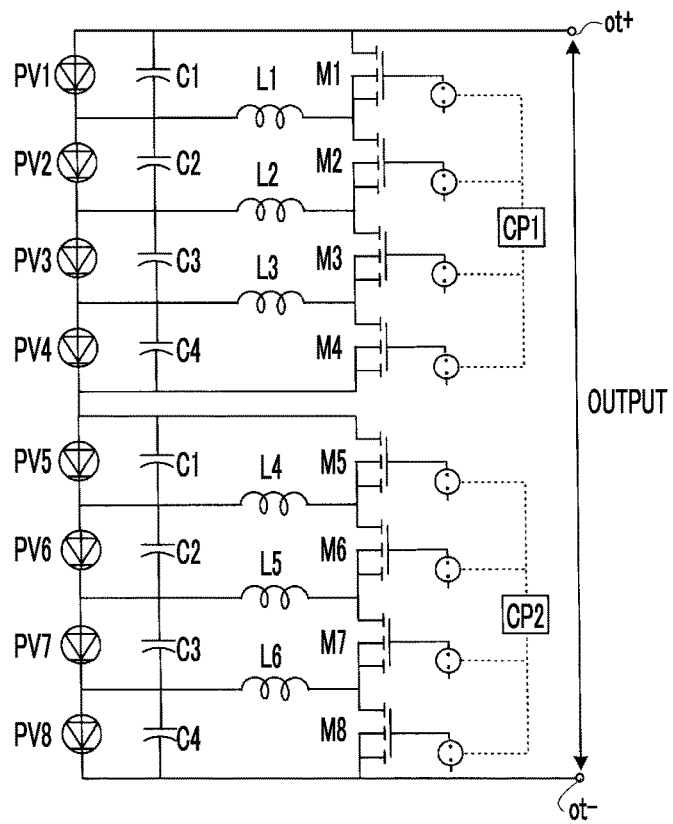
Figure 6B:
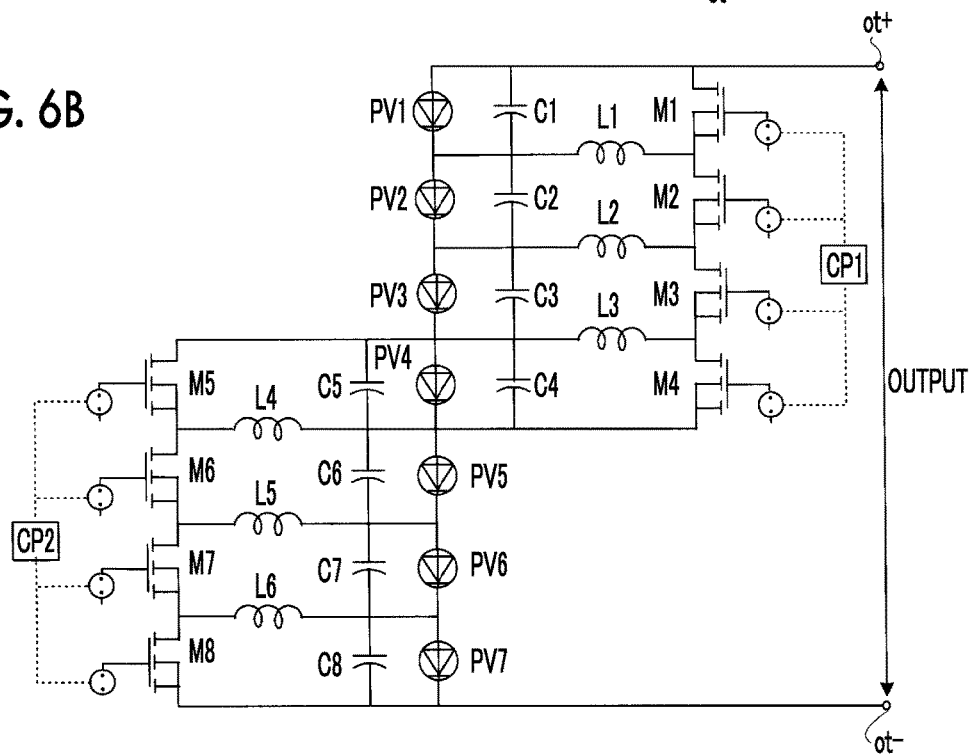
Figure 7:
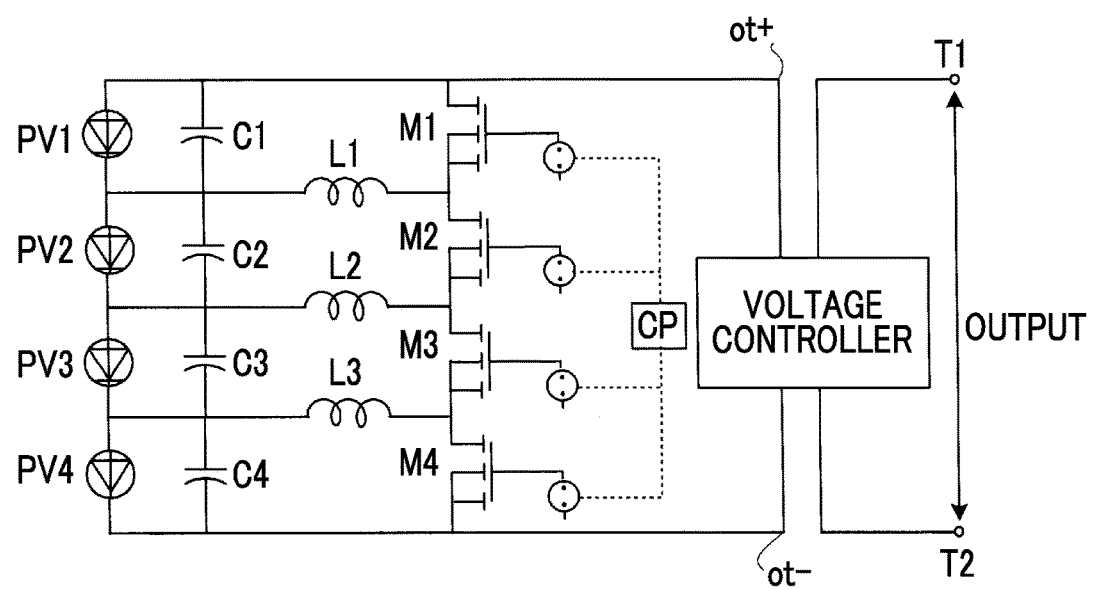
Figure 8:
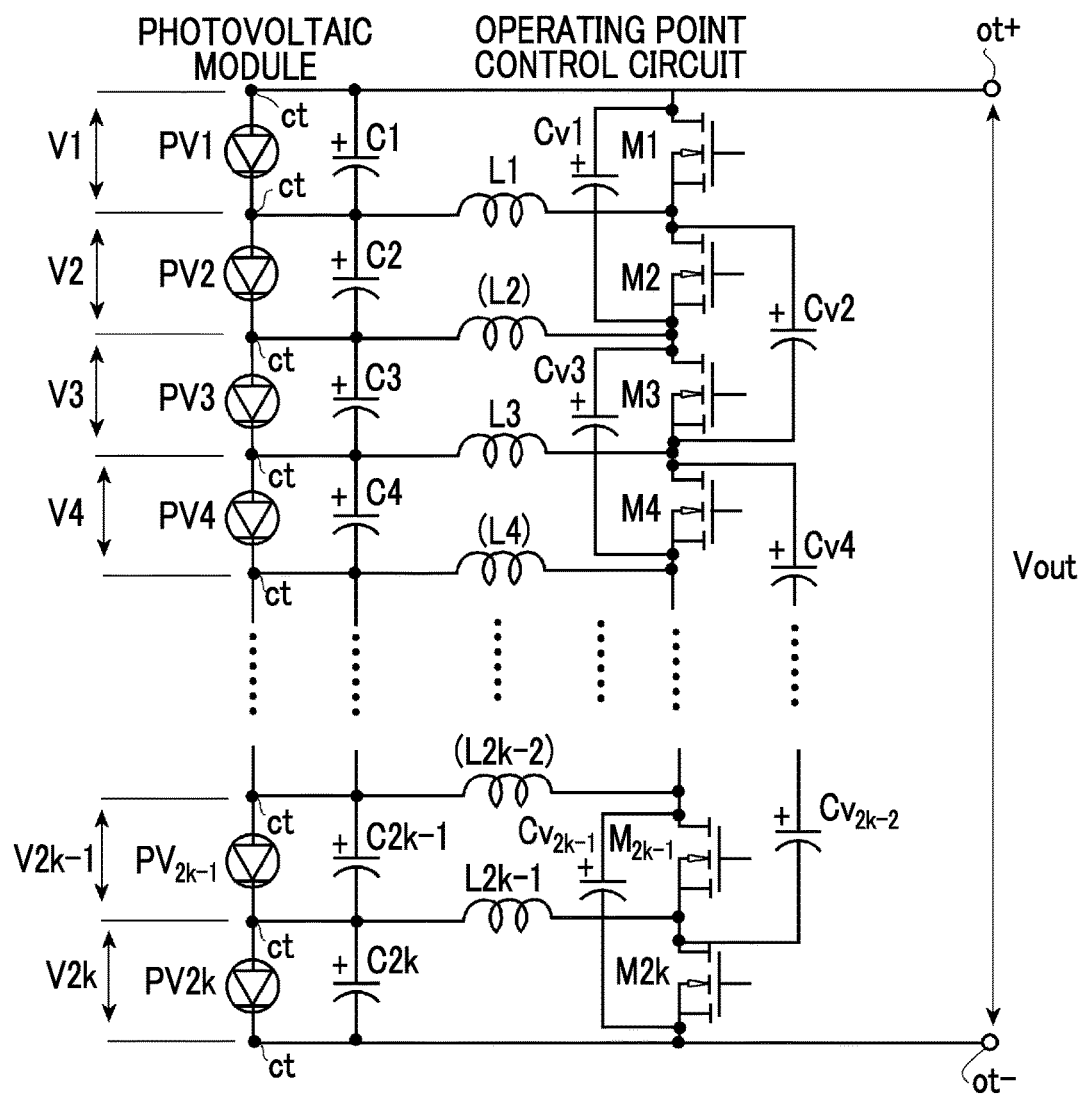
Figure 9A:
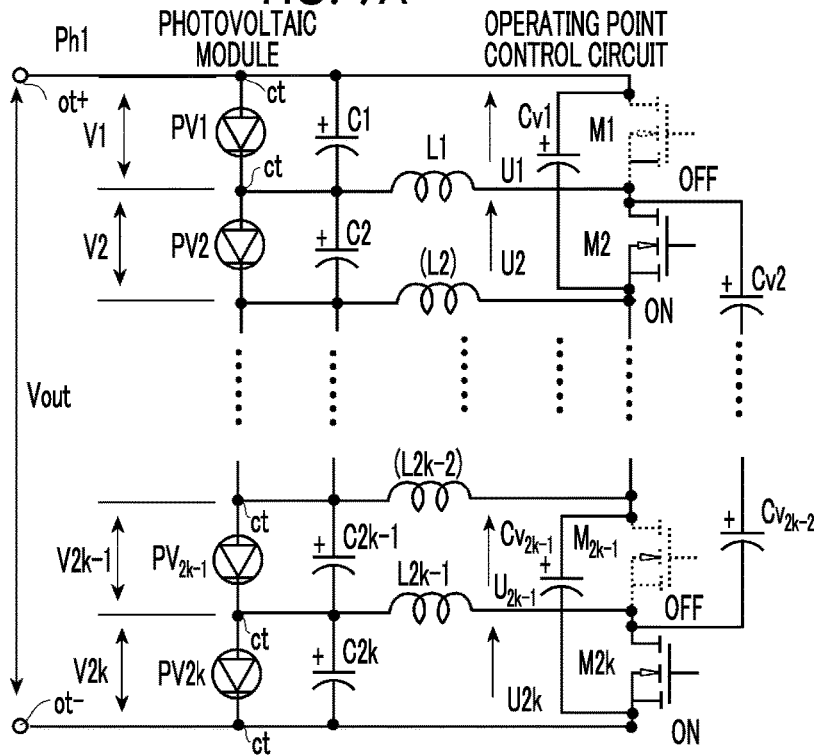
Figure 9B:
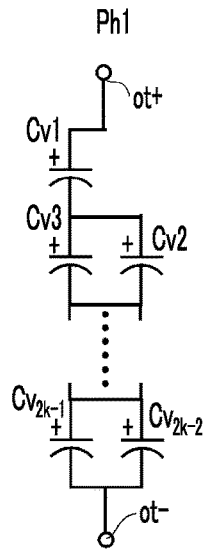
Figure 9C:
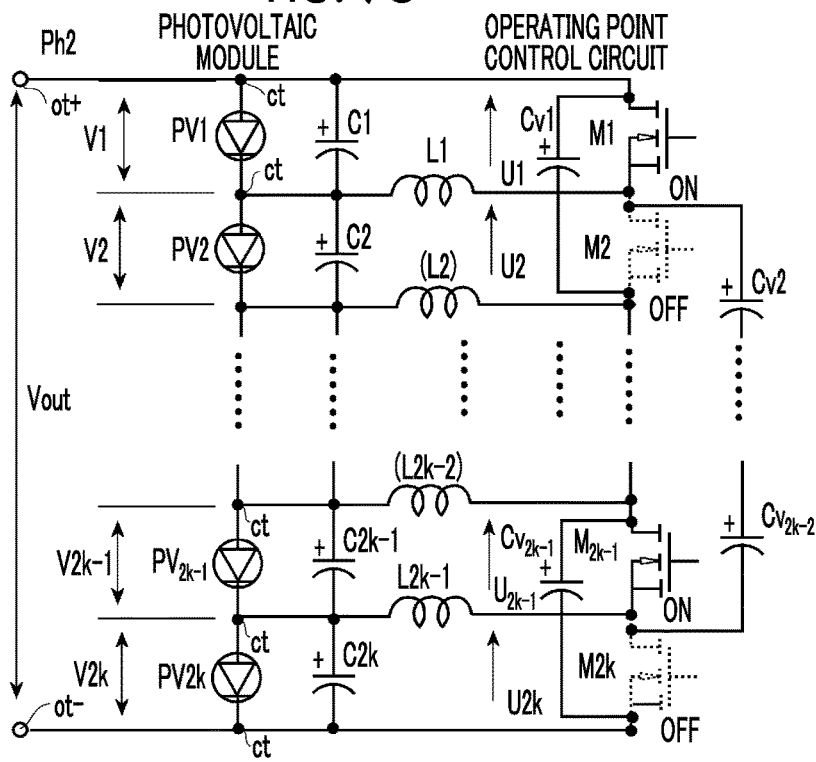
Figure 9D:
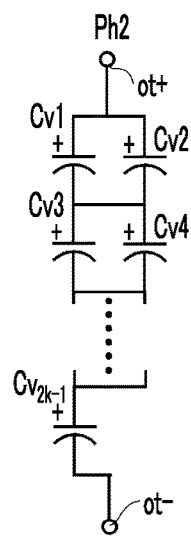
Figure 10A:
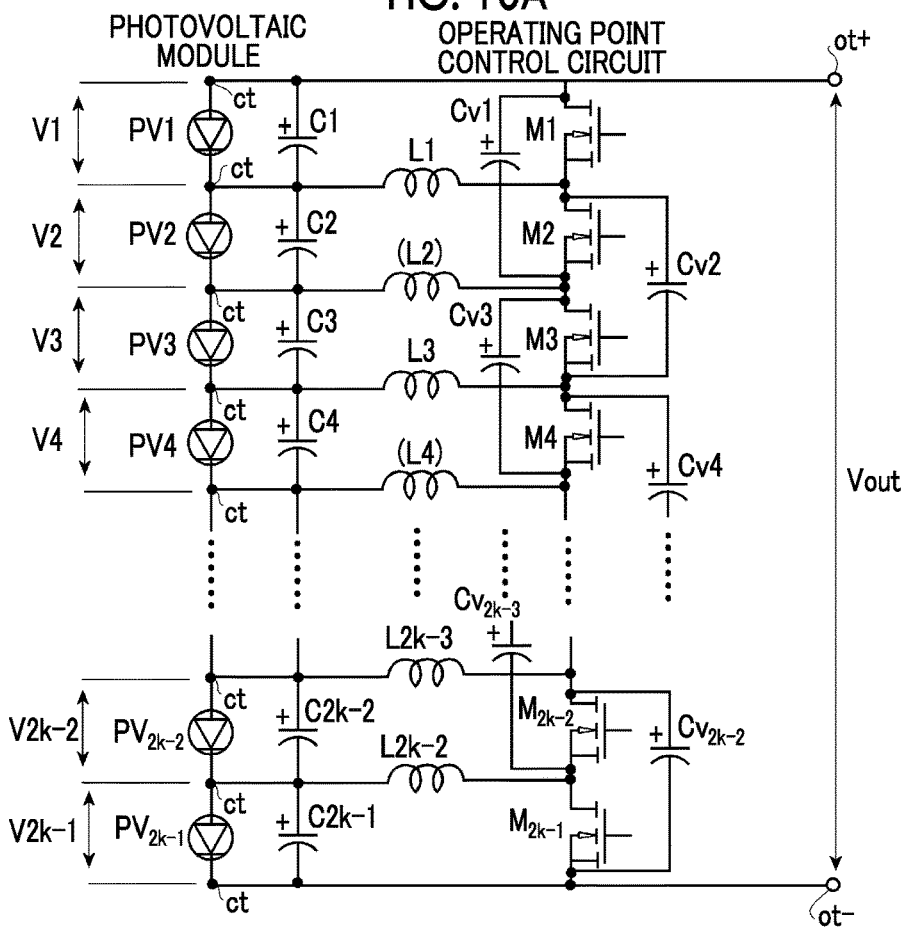
Figure 10B:
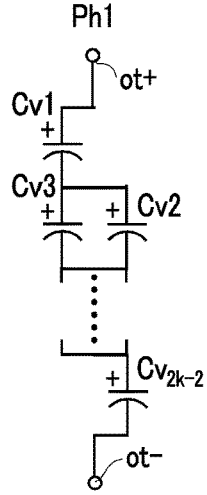
Figure 10C:
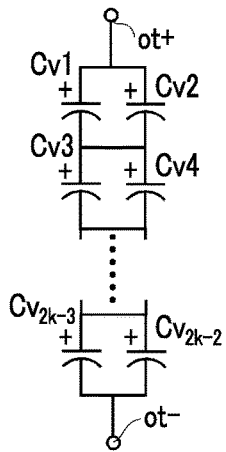
Figure 11A:
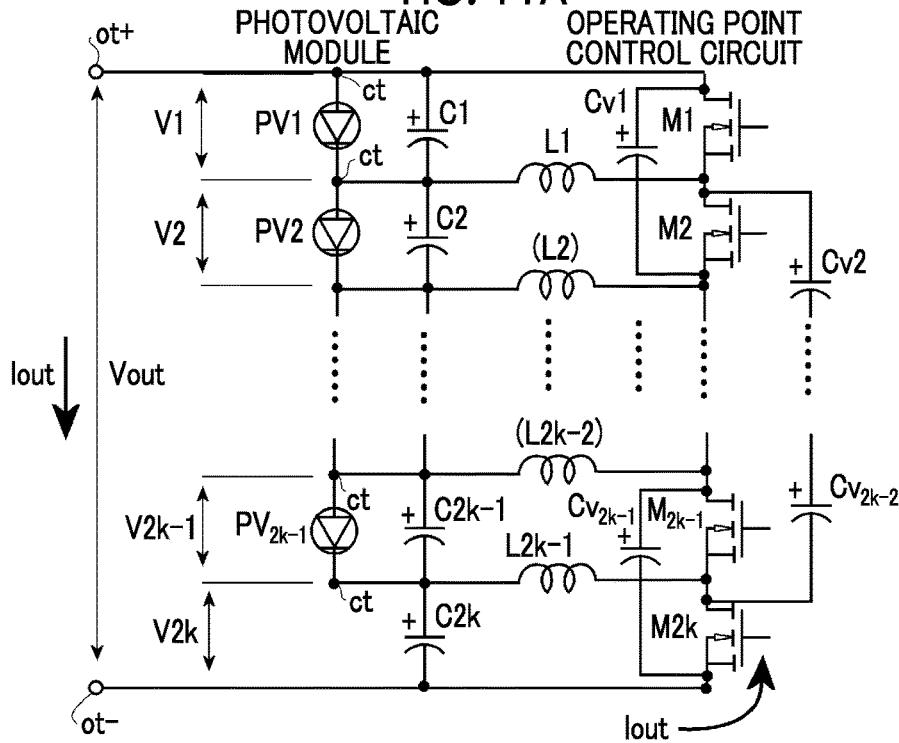
Figure 11B:
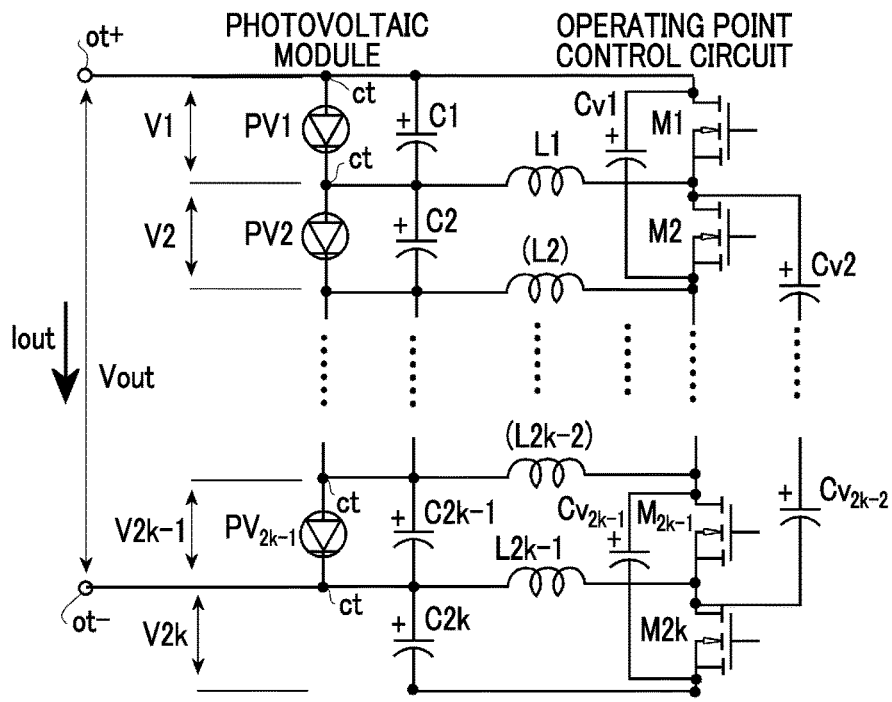
Figure 12A:
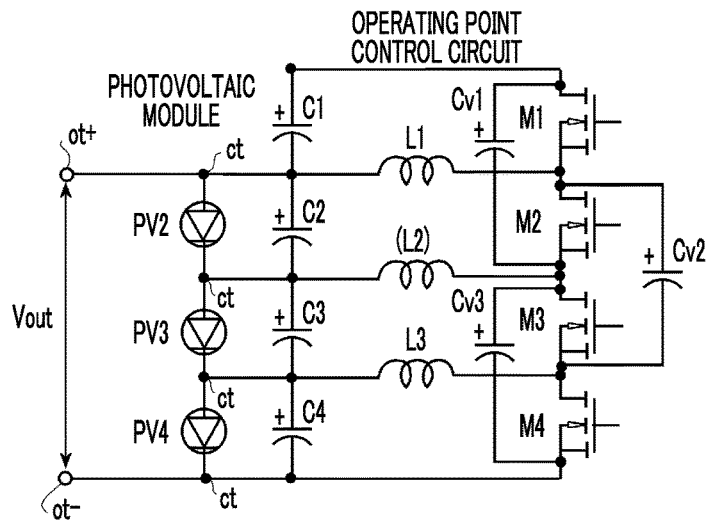
Figure 12B:
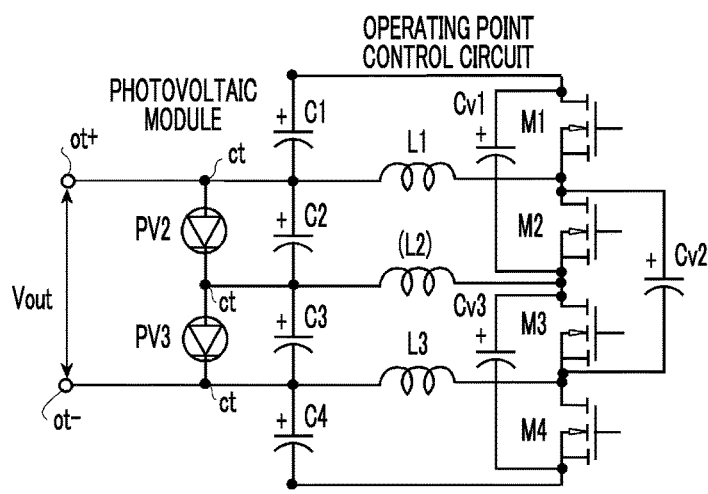
Figure 12C:
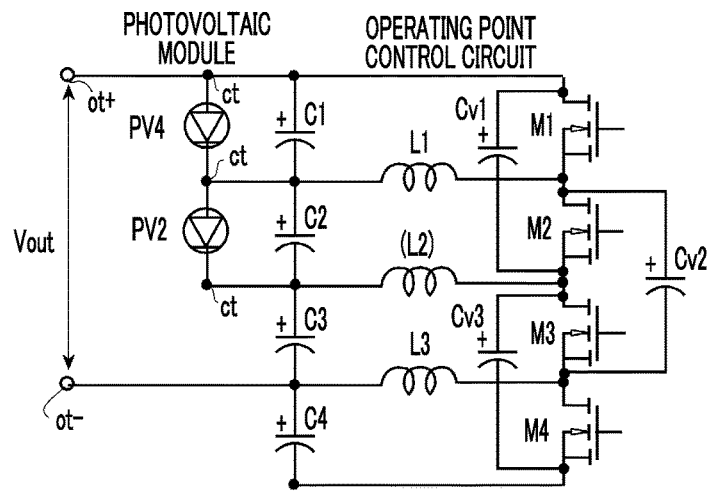
Figure 13:
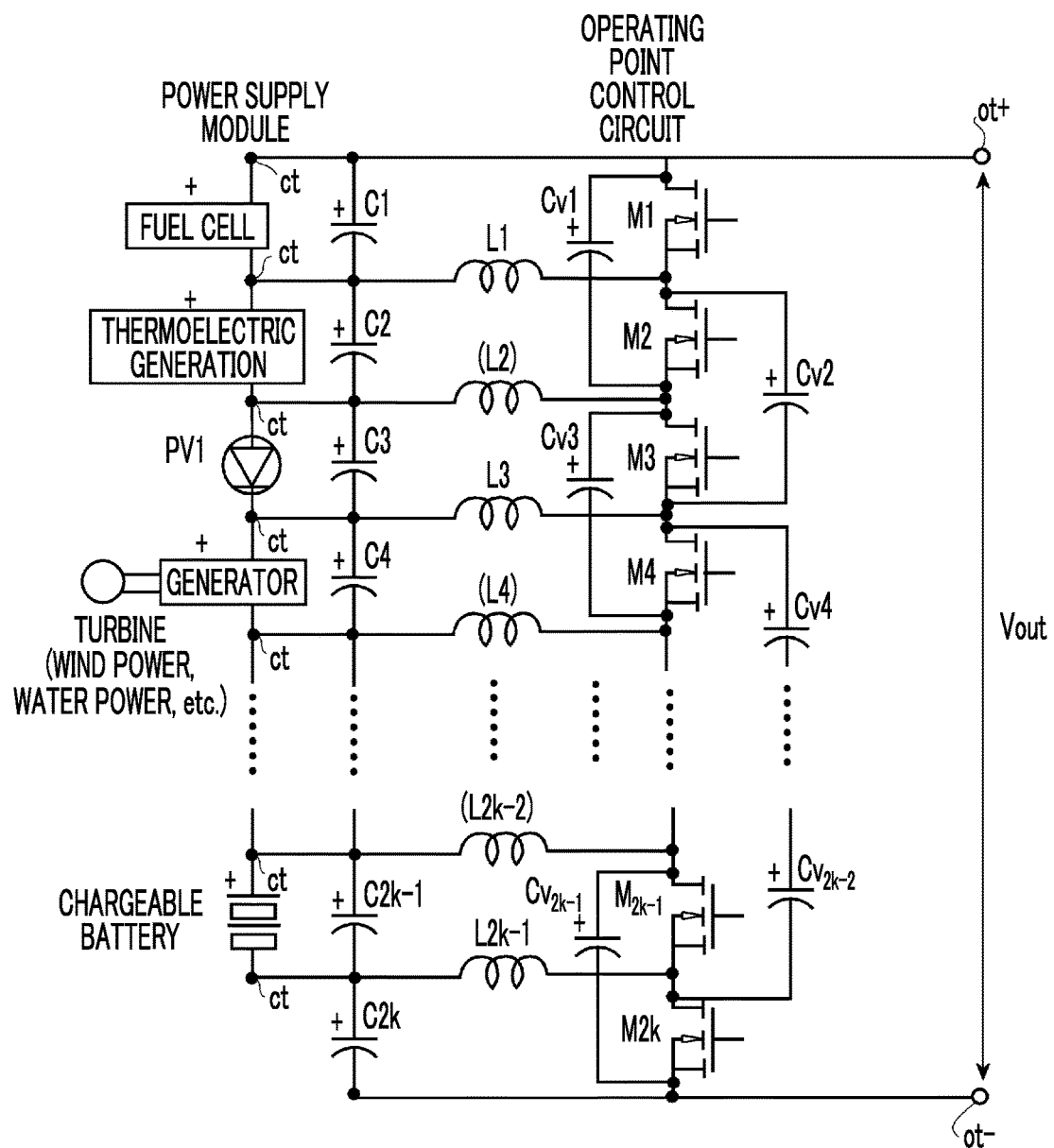

The right part of FIG. 5A is a timing chart of the ON/OFF states of the switching elements which can be employed by various circuit configurations according to embodiments of the disclosure and illustrates an example in which the ON/OFF states of an array of switching elements are switched between phase 1 (Ph1) and phase 2 (Ph2), the left part of FIG. 5A illustrates an example of a combination of a switching element group which is switched to the OFF state in phase 1 and a switching element group which is switched to the OFF state in phase 2 in the circuit configurations illustrated in FIGS. 2A and 2B, FIGS. 6A and 6B, FIG. 8, and the like;

FIG. 5B is a circuit diagram schematically illustrating a circuit state in which all the switching elements odd-numbered from one end of an array of switching elements connected in series are in the OFF state and all the switching elements even-numbered from the one end are in the ON state in phase 1 in the ON/OFF states of the array of switching elements of the device according to the disclosure;

FIG. 5C is a circuit diagram schematically illustrating a circuit state in which all the switching elements odd-numbered from one end of an array of switching elements connected in series are in the ON state and all the switching elements even-numbered from the one end are in the OFF state in phase 2 in the ON/OFF states of the array of switching elements of the device according to the disclosure;

FIG. 6A is a circuit diagram illustrating a configuration of a photovoltaic device according to another embodiment of the disclosure, in which a plurality of photovoltaic cells connected between output terminals are grouped into a plurality of units, a photovoltaic operating point control circuit is individually provided for each of the plurality of units, and each photovoltaic operating point control circuit controls switching of the ON/OFF states of the switching elements belonging to the corresponding unit;

FIG. 6B is a circuit diagram illustrating a configuration of a photovoltaic device according to another embodiment of the disclosure, in which a plurality of photovoltaic cells connected between output terminals are grouped into a plurality of units sharing one photovoltaic cell at a boundary thereof, a photovoltaic operating point control circuit is individually provided for each of the plurality of units, and each photovoltaic operating point control circuit controls switching of the ON/OFF states of the switching elements belonging to the corresponding unit;

FIG. 7 is a circuit diagram illustrating a configuration of a photovoltaic device according to another embodiment of the disclosure, in which output terminals of a plurality of photovoltaic cells connected in series are connected to load terminals via a voltage controller;

FIG. 8 is a circuit configuration diagram schematically illustrating an example of a device (a photovoltaic device) including a combination of a photovoltaic module in which 2k (where k is a positive integer) photovoltaic cells are connected in series and a photovoltaic operating point control circuit and including voltage stabilization capacitors according to the disclosure;

FIG. 9A is a circuit configuration diagram when the ON/OFF states of the switching elements are in phase 1 [when all the switching elements odd-numbered from one end of an array of switching elements connected in series are in the OFF state and all the switching elements even-numbered from the one end are in the ON state] in the circuit configuration illustrated in FIG. 8;

FIG. 9B is a diagram illustrating a connected state of an array of voltage stabilization capacitors at that time;

FIG. 9C is a circuit configuration diagram when the ON/OFF states of the switching elements are in phase 2 [when all the switching elements odd-numbered from one end of an array of switching elements connected in series are in the ON state and all the switching elements even-numbered from the one end are in the OFF state] in the circuit configuration illustrated in FIG. 8;

FIG. 9D is a diagram illustrating a connected state of an array of voltage stabilization capacitors at that time;

FIG. 10A is a circuit configuration diagram schematically illustrating an example of a device (a photovoltaic device) including a combination of a photovoltaic module in which 2k−1 (where k is a positive integer) photovoltaic cells are connected in series and a photovoltaic operating point control circuit and including voltage stabilization capacitors according to the disclosure;

FIG. 10B is a diagram illustrating a connected state of an array of voltage stabilization capacitors when the ON/OFF states of the switching elements are in phase 1 in the circuit configuration illustrated in FIG. 10A;

FIG. 10C is a diagram illustrating a connected state of an array of voltage stabilization capacitors when the ON/OFF states of the switching elements are in phase 2;

FIG. 11A is an example of a circuit configuration of a device according to an embodiment of the disclosure in which a 2k-stage (even-stage) step-up/down chopper circuit including voltage stabilization capacitors is connected to a photovoltaic module including 2k−1 (odd-numbered) photovoltaic cells, where FIG. 11A illustrates a configuration in which an additional capacitor and an additional switching element are connected between output terminals;

FIG. 11B is an example of a circuit configuration of a device according to an embodiment of the disclosure in which a 2k-stage (even-stage) step-up/down chopper circuit including voltage stabilization capacitors is connected to a photovoltaic module including 2k−1 (odd-numbered) photovoltaic cells, where FIG. 11B illustrates a configuration in which an additional capacitor and an additional switching element are connected outside the output terminals;

FIG. 12A is a diagram illustrating other circuit configurations of the device according to an embodiment of the disclosure including voltage stabilization capacitors;

FIG. 12B is a diagram illustrating other circuit configurations of the device according to an embodiment of the disclosure including voltage stabilization capacitors;

FIG. 12C is a diagram illustrating other circuit configurations of the device according to an embodiment of the disclosure including voltage stabilization capacitors; and FIG. 13 is a circuit configuration diagram when other power supply cells instead of photovoltaic cells are connected in series in the photovoltaic operating point control circuit according to the disclosure including the voltage stabilization capacitors.

DETAILED DESCRIPTION OF EMBODIMENTS

Hereinafter, exemplary embodiments of the disclosure will be described in detail with reference to the accompanying drawings. In the drawings, the same reference signs denote the same elements.

Basic Configuration of Photovoltaic Operating Point Control Circuit

A circuit configuration of a photovoltaic operating point control circuit for photovoltaic cells in a photovoltaic device according to embodiments of the disclosure is basically the same as a configuration of a multistage step-up/down chopper circuit described in Toshihisa SHIMIZU and six others, pages 57-60, Solar/Wind Energy Lecture Papers, 1996, Toshihisa SHIMIZU, pages 22-27, FB Technical News No. 56, Nov. 1, 2000, and Toshihisa SHIMIZU and three others, pages 293-300, "Generation Control Circuit for Photovoltaic Modules" IEEE TRANSACTIONS ON POWER ELECTRONICS, VOL. 16, NO. 3, May, 2001. Specifically, referring to FIG. 2A, when a photovoltaic module is constituted by connecting n (where n is a positive integer; four in the drawing) photovoltaic cells $PV1, PV2, \ldots, PVj, \ldots, PVn$ in series, a capacitor Cj ($C1, C2, \ldots, Cn$) and a switching element Mj ($M1, M2, \ldots, Mn$) are connected in parallel to each of a plurality of photovoltaic cells PVj connected in series via an electrode connection terminal ct between a pair of output terminals ot+ and ot− at both ends of the photovoltaic module, and an inductor Lj ($L1, L2, \ldots, L_{n-1}$) is inserted between the electrode terminal ct of each photovoltaic cell PVj and the terminal of the corresponding switching element Mj. That is, in the circuit configuration illustrated in FIG. 2A, an n-stage chopper circuit in which a chopper circuit is connected to each of the n photovoltaic cells connected in series is constituted. Each switching element Mj may be a switching element including a control input Sj and selectively connecting or cutting off upper and lower terminals in the drawing, that is, terminals of both ends of the corresponding photovoltaic cell PVj and the corresponding capacitor Cj connected in parallel, and may be typically a switching element such as a MOSFET which is used in a normal photovoltaic operating point control circuit for photovoltaic cells. The capacitors and the inductors may be arbitrary ones which are normally used in the art.

When the photovoltaic operating point control circuit is actually used, an MPPT control circuit or other voltage/current controller (not illustrated) that controls a voltage between output terminals is connected between the output terminals ot+ and ot−, and the voltage/current controller maintains an output voltage between output terminals at a required voltage or a desired voltage. A control signal is supplied to the control input Sj ($S1, S2, \ldots, Sn$) of each switching element Mj from a switching controller CP, and the switching element Mj is periodically switched between an ON state (a connected state) in which the terminals at both ends of the corresponding photovoltaic cell PVj and the corresponding capacitor Cj connected in parallel are connected and an OFF state (a cut-off state) in which the connection is cut off in aspects which will be described in detail later.

Figure 2A:
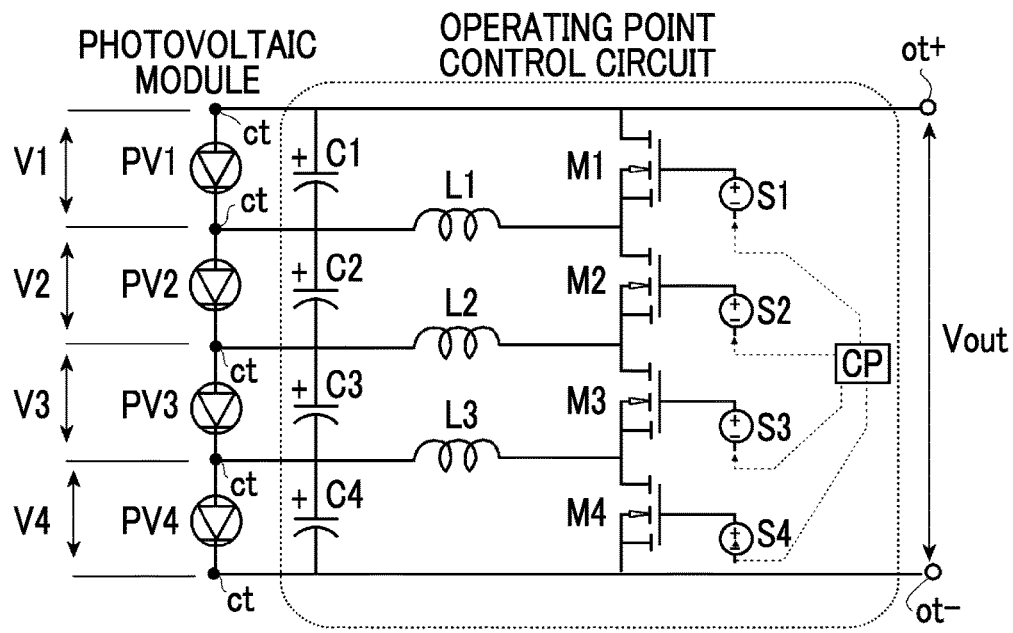
FIG. 2A is a circuit configuration diagram illustrating an example of a configuration of a photovoltaic device according to the disclosure and an example in which photovoltaic cells are connected to all stages of a multistage step-up/down chopper circuit.
Figure 2B:
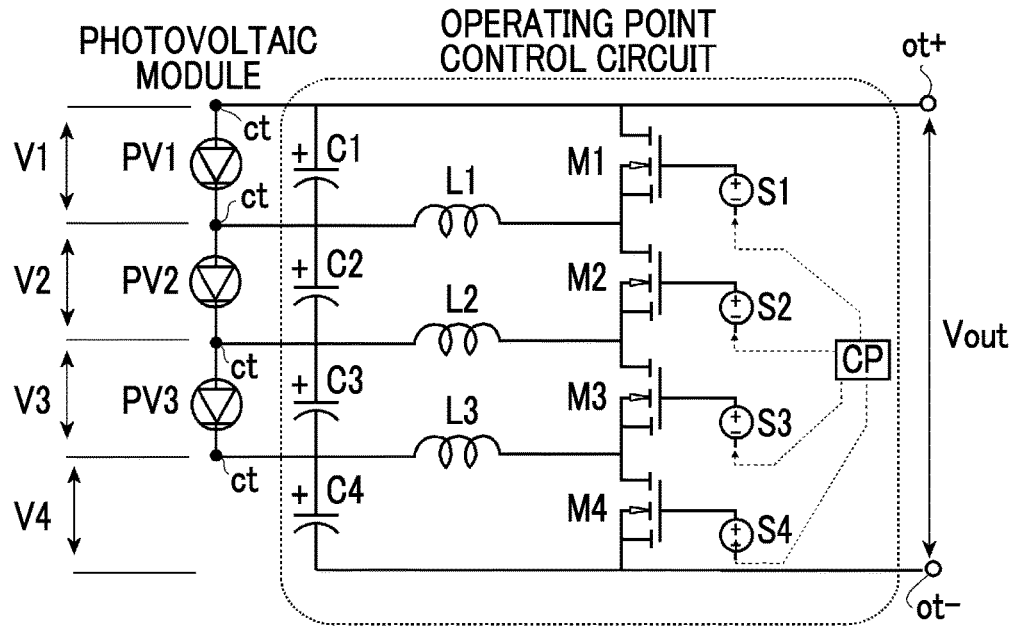
FIG. 2B is a circuit configuration diagram illustrating an example of a configuration of a photovoltaic device according to the disclosure and an example in which a photovoltaic cell is not connected to one stage of the multistage step-up/down chopper circuit (an example in which an additional capacitor and an additional switching element are provided)

As illustrated in FIG. 2B, in an n-stage chopper circuit in which a chopper circuit is connected to each of n (three in the drawing) photovoltaic cells connected in series, a capacitor $C_{n+1}$ may be added in series with a capacitor array between a photovoltaic cell array and the output terminal ot– and a switching element $M_{n+1}$ may be added to a switching element array (see JP 2016-214061 A). In other words, a (n+1)-stage chopper circuit may be constituted and no photovoltaic cell may be disposed in one stage thereof. As will be described later, plainly speaking, the added chopper circuit part (the capacitor $C_{n+1}$, the switching element $M_{n+1}$, and the inductor Ln) performs a function of stepping up the voltage between output terminals to be higher than the sum of the generated voltages of the photovoltaic cells connected in series. The additional capacitor and the additional switching element for the function of stepping up the voltage between output terminals may be inserted between the stages of the photovoltaic cells connected in series or may be disposed in a plurality of sets (that is, when n photovoltaic cells are connected in series, an (n+m)-stage chopper circuit (where m is a positive integer) may be used).

Switching Control of Switching Elements in Photovoltaic Operating Point Control Circuit In a photovoltaic device including the photovoltaic module and the photovoltaic operating point control circuit illustrated in FIG. 2A or 2B, the periodic switching of the switching element Mj between the ON state and the OFF state may be performed in various aspects. Particularly, in this embodiment, a cutoff duty ratio, that is, a ratio of a duration of the OFF state to a duration of a predetermined cycle (a length of a period from a time at which the switching element is switched from the ON state to the OFF state to a time at which the switching element is switched to the OFF state again after the switching element is switched to the ON state, that is, a sum of a duration of the OFF state and a duration of the ON state), is uniformly fixed for all the switching elements Mj (that is, set to the same value). Hereinafter, the "cutoff duty ratio" is simply referred to as a "duty ratio." The specific example of the switching control of the ON/OFF (connected/cut-off) states of the switching elements Mj may be one of the following aspects.

Figure 1:
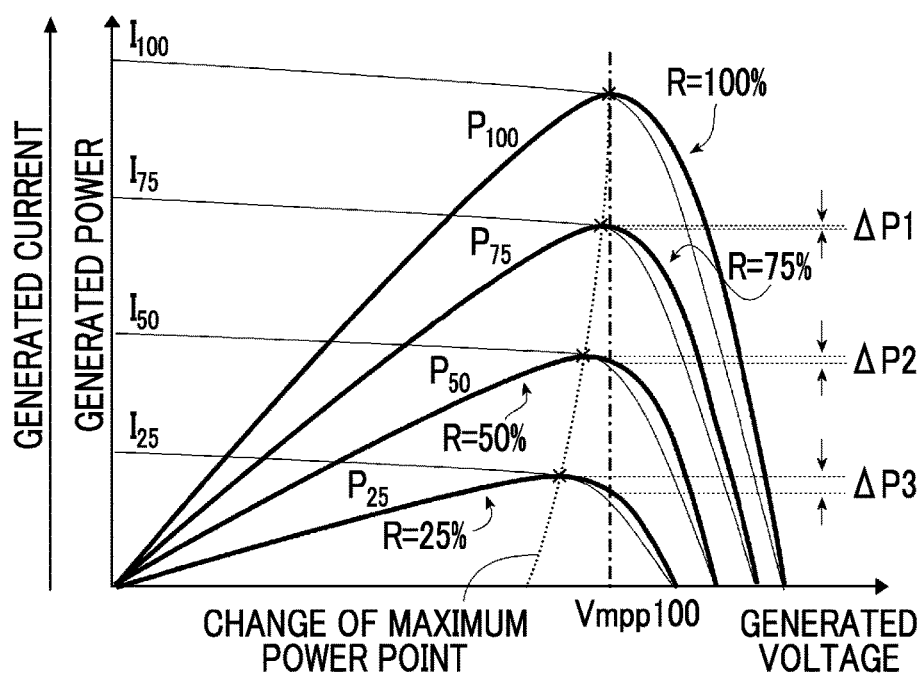
FIG. 1 is a characteristic diagram schematically illustrating changes of a generated current and a generated power with respect to a generated voltage of a photovoltaic cell having various amounts of light received R, where R denotes a ratio of an amount of light received when an amount of light received at R=100% is defined as 100%.

(First Aspect) In a first aspect of the switching control of the ON/OFF states of the switching elements Mj, as illustrated in FIG. 3A, states of the switching elements may be controlled such that the duty ratios of all the switching elements Mj are the same and the times at which all the switching elements are switched to the OFF state are different from each other. That is, in this case, the number of switching elements which are switched to the OFF state at a time is always one. In this aspect, since currents having different magnitudes can flow in the photovoltaic cells connected to the stages of the n-stage chopper circuit (or a capacitor in a stage which is not connected to a photovoltaic cell), a generated voltage of the photovoltaic cell in each stage (or a held voltage of the capacitor) Vj, the duty ratio Dj, and the voltage between output terminals Vout satisfy relationships of $Vj=Dj \cdot Vout$ ... (1a), $Dj=D$ ... (1b), $\Sigma Dj=1$ ... (1c) (a sum is j=1 to n), and $D=1/n$ ... (1d), and the generated voltage of each photovoltaic cell (or the held voltage of each capacitor) Vj is given by $Vj=Vout/n$ ... (1e). Accordingly, for example, when the voltage between output terminals Vout is adjusted such that Vout/n is equal to the generated voltage $V_{mpp100}$ at the maximum power point of the photovoltaic cell having a maximum amount of light received, a state in which the generated voltages of all the photovoltaic cells are substantially equal to $V_{mpp100}$ can be realized as illustrated in FIG. 1. In this case, as described above, even when an amount of light received decreases, a decrease in output power is suppressed to be relatively small without adjusting the individual duty ratios of the photovoltaic cells.

When all the stages of the n-stage step-up/down chopper circuit are connected to the photovoltaic cells as illustrated in FIG. 2A, the sum of the generated voltages Vpj of the photovoltaic cells is $\Sigma Vpj=n \times Vout/n=Vout$ ... (2a) ($Vout=\Sigma Vpj=V1+V2+V3+V4$ in the example illustrated in FIG. 2A) and thus the sum of the generated voltages of the photovoltaic cells is equal to the voltage between output terminals. On the other hand, when a stage which is not connected to the photovoltaic cell is present in the n-stage step-up/down chopper circuit as illustrated in FIG. 2B, the sum of the sum $\Sigma Vpj$ of the generated voltages Vpj of the photovoltaic cells and the sum $\Sigma Vcj$ of the held voltages Vcj of the capacitors in the stages which are not connected to the photovoltaic cells is Vout and thus $Vout=\Sigma Vpj+\Sigma Vcj$ ... (2a) ($\Sigma Vpj=V1+V2+V3$ and $\Sigma Vcj=V4$ (which is the held voltage of the capacitor C4) in the example illustrated in FIG. 2B) and $Vout>\Sigma Vpj$ ... (2b) are satisfied. That is, the circuit part of the stage which is not connected to the photovoltaic cell performs a function of stepping up the voltage between output terminals of the photovoltaic module to be higher than the sum of the actual generated voltages of the photovoltaic cells. The circuit part performing the step-up function can be similarly applied to all circuits to be described below.

(Second aspect) In a second aspect of the switching control of the ON/OFF states of the switching elements Mj, the states of the switching elements may be controlled such that the duty ratios of all the switching elements Mj are the same, the sum of the cutoff durations of all the switching elements in one cycle is larger than the duration of one cycle, and a part of the cutoff times overlap in the neighboring cutoff times or the neighboring two switching elements are switched to the OFF state (the cut-off state) at a time as illustrated in FIGS. 3B and 3C. In this aspect, the states of the switching elements may be controlled such that the neighboring two switching elements are switched to the OFF state at a time and the switching element which is switched to the OFF state shifts sequentially from one end of a switching element array in which the switching elements are connected in series to the other end one at a time. When the switching elements are switched to the OFF state one at a time as in the first aspect, each switching element needs to withstand the voltage between output terminals in the OFF state, but when two switching elements are switched to the OFF state at a time, the voltage between output terminals is distributed and applied to the two switching elements in the OFF state and it is thus possible to decrease a voltage which is withstood by one switching element (a required withstanding voltage) in comparison with in the first aspect.

Figure 4A:
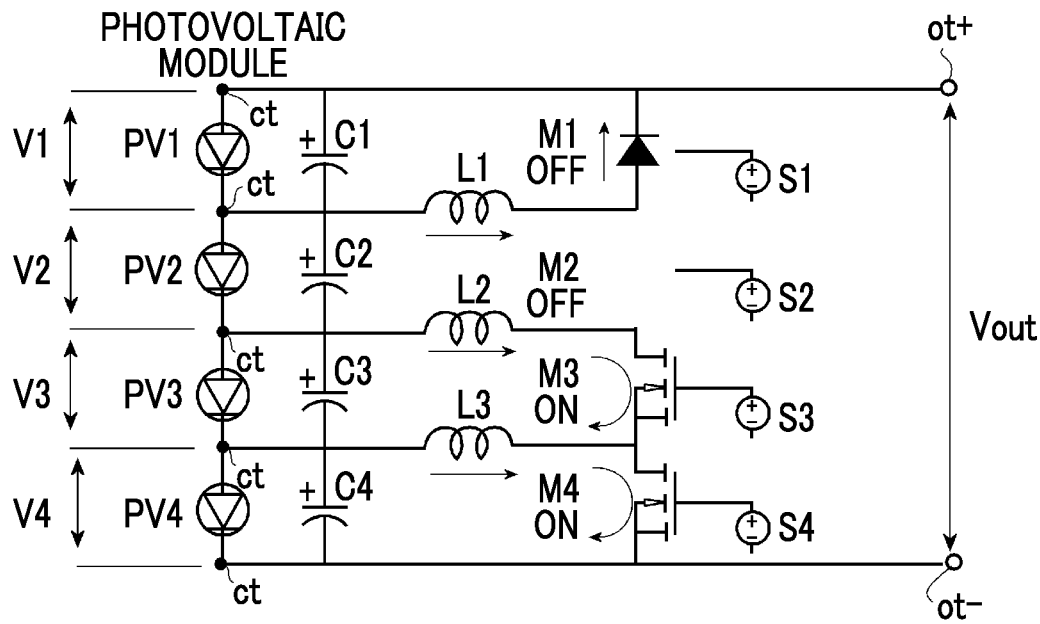
FIG. 4A is a circuit configuration diagram schematically illustrating a flow of a current when the ON/OFF states of the switching elements are controlled in the timing chart illustrated in FIG. 3C.
Figure 4B:
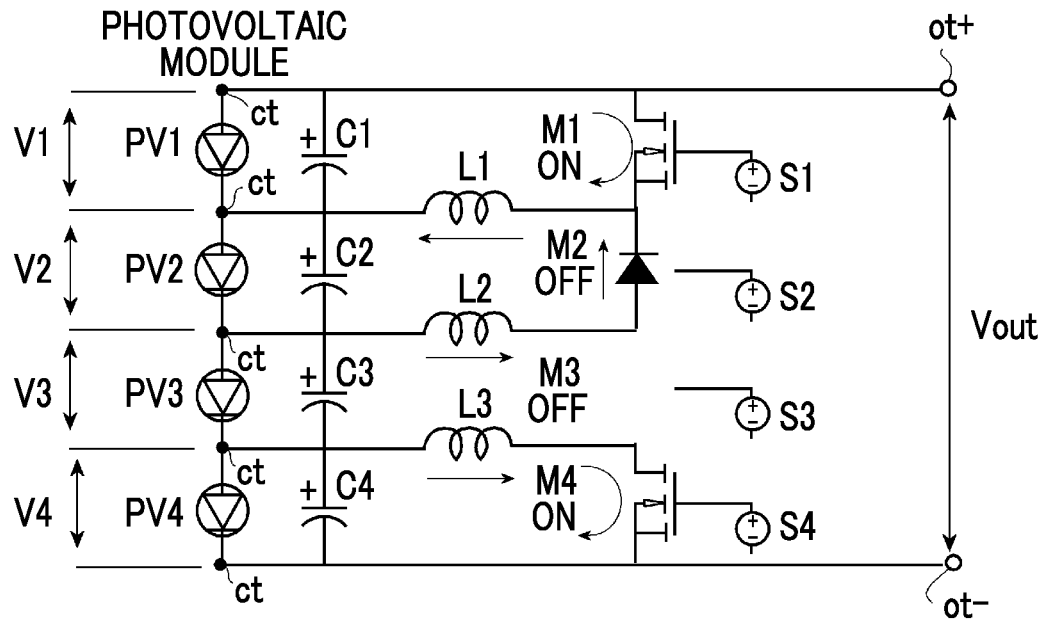
FIG. 4B is a circuit configuration diagram schematically illustrating a flow of a current when the ON/OFF states of the switching elements are controlled in the timing chart illustrated in FIG. 3C.

In the second aspect of the switching control of the switching elements, the generated voltage Vj of each photovoltaic cell (or the held voltage of each capacitor) is determined by Equation (1e) as in the first aspect. That is, in this aspect, as illustrated in FIGS. 4A and 4B, a state in which two neighboring switching elements are simultaneously switched to the OFF state is present, a parasitic diode allowing a current to flow from the source side to the drain side is generally present in a switching element, and the parasitic diode in the switching element which is first in the OFF state among the two neighboring switching elements allows a current to flow from an inductor connected to the source side thereof. Then, even in a state in which a control signal of the switching element is input to the control input such that the two neighboring switching elements are simultaneously switched to the OFF state, the number of switching elements which are switched to the cut-off state at a time is the same as in the state in which only one switching element is switched to the cut-off state at a time, and the generated voltage of each photovoltaic cell (the held voltage of each capacitor) Vj is given to be the same as in the first aspect. Accordingly, when the states of the switching elements are controlled such that the times at which all the switching elements are switched to the OFF state are different from each other as in the first aspect, it can be said that the switching of the ON/OFF states is not much rigid.

(Third Aspect) In a third aspect of the switching control of the ON/OFF states of the switching elements Mj, as in the timing chart illustrated in the right part of FIG. 5A, a plurality of switching elements (which includes an additional switching element) connected in series may be grouped into a first group (I) and a second group (II), and the states of all the switching elements may be alternately switched between phase 1 (Ph1) in which all the switching elements in the first group are switched to the OFF state and all the switching elements in the second group are switched to the ON state and phase 2 (Ph2) in which all the switching elements in the first group are switched to the ON state and all the switching elements in the second group are switched to the OFF state. The grouping of the switching elements is arbitrary, and for example, in a circuit configuration including the switching elements M1 to M4 as illustrated in FIGS. 2A and 2B, (M1, M2) and (M3, M4) may be allocated to the first group and the second group, respectively, or (M1, M3) and (M2, M4) may be allocated to the first group and the second group, respectively as illustrated in the left part of FIG. 5A. As illustrated in FIGS. 5B and 5C, in the circuit configuration in which n switching elements are present, the switching elements $M_{2m-1}$ which are connected to the chopper circuits of the odd-numbered stages from one of the output terminals, for example, a positive electrode side of the photovoltaic module, may be allocated to the first group and the switching elements $M_{2m}$ which are connected to the chopper circuits of the even-numbered stages may be allocated to the second group (where m is a positive integer). In this aspect, as illustrated in the timing chart on the right side of FIG. 5A, since the states of the switching elements are alternately switched between phase 1 (Ph1) and phase 2 (Ph2) in one cycle Ts and the duty ratio is uniformly fixed for all the switching elements, the duty ratio D is $D=\frac{1}{2}=0.5$ . . . (3).

In the third aspect, particularly, in the configuration in which the switching elements $M_{2m-1}$ are allocated to the first group and the switching elements $M_{2m}$ are allocated to the second group, the generated voltage of each photovoltaic cell (or the held voltage of each capacitor) Vj is determined by the number of stages of the chopper circuits interposed between the output terminals (that is, the number of capacitors and switching elements). Specifically, $\Sigma Vj=Vout$ . . . (4a), $Vj^I=VI$ . . . (4b), and $Vj^{II}=VII$ . . . (4c) are satisfied from a condition that the sum of the generated voltages of the photovoltaic cells (or the held voltages of the capacitors) Vj is equal to the voltage between output terminals Vout and a condition that the generated voltages of the photovoltaic cells (or the held voltages of the capacitors) Vj in which the switching elements are simultaneously switched to the OFF state are equal to each other. Here, $Vj^I$ denotes the generated voltages of the photovoltaic cells (or the held voltages of the capacitors) Vj in the first group, and $Vj^{II}$ denote the generated voltages of the photovoltaic cells (or the held voltages of the capacitors) Vj in the second group. VI and VII denote voltage values of the generated voltages of the photovoltaic cells (or the held voltages of the capacitors) in the first group and the second group, respectively. When chopper circuits of 2k stages are present between the output terminals ot+ and ot− (where k is a positive integer), the number of stages in which the switching elements are switched to the OFF state in phase 1 (FIG. 5B) and the number of stages in which the switching elements are switched to the OFF state in phase 2 (FIG. 5C) are the same number of k and thus $Vj^I=VI$ $Vj^{II}=VII$ . . . (4d) is satisfied. As a result, since the generated voltages of all the photovoltaic cells (or the held voltages of the capacitors) Vj are the same, $Vj=Vout/2k$ . . . (4e) is satisfied.

On the other hand, when chopper circuits of 2k−1 stages are present between the output terminals ot+ and ot−, the number of stages in which the switching elements are switched to the OFF state in phase 1 (FIG. 5B) is k and the number of stages in which the switching elements are switched to the OFF state in phase 2 (FIG. 5C) is k−1. Since phase 1 and phase 2 are realized at equal intervals, the sum of the generated voltages of the photovoltaic cells (or the held voltages of the capacitors) $Vj^I$ in the stages (the first group) in which the switching elements are switched to OFF state in phase 1 and the sum of the generated voltages of the photovoltaic cells (or the held voltages of the capacitors) $Vj^{II}$ in the stages (the second group) in which the switching elements are switched to OFF state in phase 2 are the same and thus relationships of $Vout=\Sigma Vji^I+\Sigma Vj^{II}$ . . . (4f) and $\Sigma Vj^I=kVI=\Sigma Vj^{II}=(k-1)VII=Vout/2$ . . . (4g) are satisfied. As a result, the generated voltages of the photovoltaic cells (or the held voltages of the capacitors) $Vj^I$ in the first group and the generated voltages of the photovoltaic cells (or the held voltages of the capacitors) $Vj^{II}$ in the second group are given by $Vj^I=Vout/2k$ . . . (4h) and $Vj^{II}=Vout/2(k-1)$ . . . (4i), respectively. However, when switching between phase 1 and phase 2 is satisfactorily fast (when the capacitance of the capacitor Cj is satisfactorily large), the voltages held by the chopper circuits are the same and thus $Vj=Vout/(2k-1)$ is satisfied. [More generally, in a circuit configuration in which the number of stages in the first group is x and the number of stages in the second group is y, $Vj^I$ and $Vj^{II}$ are given by $Vj^I=Vout/2x$ and $Vj^{II}=Vout/2y$, respectively. Here, as a ratio of x and y increases, the deviation of the generated voltages of the photovoltaic cells increases and it is more difficult to obtain an advantage of decreasing a power decrease.]

According to the above-mentioned aspect in which the duty ratios of a plurality of switching elements are set to the same and the ON/OFF states are switched between two phases of phase 1 and phase 2, the time and labor required for adjusting the duty ratios of the switching elements is substantially unnecessary and the control can be much simplified, which is advantageous. As described in the second aspect, since the number of switching elements which are simultaneously switched to the OFF state is two or more (when the number of stages is greater than four, the number of switching elements which are simultaneously switched to the OFF state increases further), the voltage between output terminals which is applied to the switching elements in the OFF state is distributed to more elements and it is thus possible to advantageously reduce the withstanding voltage required for each switching element. As in the first aspect, when the voltage between output terminals Vout is adjusted such that Vout/n is equal to the generated voltage $V_{mpp100}$ at the maximum power point of the photovoltaic cell having a maximum amount of light received, a state in which the generated voltages of all the photovoltaic cells are substantially equal to $V_{mpp100}$ can be realized as illustrated in FIG. 1, and the power decrease can be suppressed to be relatively small without adjusting the individual duty ratios of the photovoltaic cells even when the amount of light received decreases.

Configuration Example of Divisional Switching Control of Switching Elements in Photovoltaic Operating Point Control Circuit When the number of cells connected in the photovoltaic module is large, the cells may be grouped into some groups and the switching control of the switching elements may be performed for each group. For example, as illustrated in FIG. 6A, a plurality of photovoltaic cells connected between the output terminals may be grouped into a plurality of units, a photovoltaic operating point control circuit may be individually provided for each of the plurality of units, and each photovoltaic operating point control circuit may perform the switching control of the switching elements belonging to the corresponding unit. In the example illustrated in the drawing, the photovoltaic cells PV1 to PV8 are grouped into a unit of PV1 to PV4 and a unit of PV5 to PV8, controllers CP1 and CP2 are individually provided for the units, and the controllers control the ON/OFF states of the switching elements M1 to M4 and M5 to M8 belonging to the corresponding units. As illustrated in FIG. 6B, a plurality of photovoltaic cells connected between the output terminals may be grouped into a plurality of units sharing one photovoltaic cell at a boundary therebetween, a photovoltaic operating point control circuit may be individually provided for each of the plurality of units, and each photovoltaic operating point control circuit may perform the switching control of the switching elements belonging to the corresponding unit. In the example illustrated in the drawing, the photovoltaic cells PV1 to PV7 are grouped into a unit of PV1 to PV4 and a unit of PV4 to PV7 sharing the photovoltaic cell PV4, controllers CP1 and CP2 are individually provided for the units, and the controllers control the ON/OFF states of the switching elements M1 to M4 and M5 to M8 belonging to the corresponding units.

As illustrated in FIGS. 6A and 6B, in the configuration in which a plurality of photovoltaic cells are grouped into a plurality of units, the switching control of the states of the switching elements in each unit may be performed in one of the first to third aspects. Particularly, when the switching control of the switching elements is performed in the third aspect, as illustrated in FIG. 5A, (M1, M2) of the switching elements M1 to M4 may be allocated to the first group, (M3, M4) may be allocated to the second group, (M5, M6) of the switching elements M5 to M8 may be allocated to the first group, and (M7, M8) may be allocated to the second group (a control state in which neighboring switching elements are simultaneously switched to the OFF state). In addition, (M1, M3) of the switching elements M1 to M4 may be allocated to the first group, (M2, M4) may be allocated to the second group, (M5, M7) of the switching elements M5 to M8 may be allocated to the first group, and (M6, M8) may be allocated to the second group (a control state in which the switching elements are alternately switched to the OFF state).

According to this configuration, since the number of photovoltaic cells in each unit is much smaller than the total number of photovoltaic cells, retrieval for which photovoltaic cells the voltage between both ends should be adjusted and what switching control of the switching elements is optimal can be performed for a shorter time in each unit, and trackability of optimization control of the photovoltaic device with respect to a variation in solar radiation as a whole can be enhanced by optimizing the switching control of each unit.

Control of Voltage Between Output Terminals

As described above, the voltage between output terminals of the photovoltaic module is adjusted and controlled by a voltage/current controller such as an MPPT control circuit such that the generated voltages of the photovoltaic cells in the photovoltaic module is desired values. In this regard, in the configuration according to the disclosure, since the duty ratios of the switching elements are uniformly fixed as described above, the generated voltages of the photovoltaic cells (or the held voltages of the capacitors) are adjusted by only the voltage between output terminals. As described above with reference to FIG. 1, when it is intended to adjust the generated voltages of the photovoltaic cells to the generated voltage at the maximum power point of a certain cell (for example, a cell having a largest amount of light received), the duty ratios are uniformly fixed and thus the voltage between output terminals is uniquely determined (the step-up voltage of the circuit part performing the step-up function (the held voltage of the capacitor) is uniquely determined and is not changed under the condition that the voltage between output terminals and the duty ratios are determined). On the other hand, the voltage between output terminals of the photovoltaic module (which includes an additional capacitor) when the generated voltages of the photovoltaic cells have been adjusted to the generated voltage at the maximum power point of a certain cell or the like cannot be said to be equal to an operating voltage of a load as a power output destination, for example, a charger. When the voltage between output terminals is different from the operating voltage of a load, the voltage between output terminals may vary and it may be difficult to maintain the state in which the generated voltages of the photovoltaic cells have been adjusted to the generated voltage of the maximum power point of a certain cell. Therefore, when the power of the photovoltaic device according to the disclosure is output to a load, the output terminals ot+ and ot− of the photovoltaic module may be connected to output destinations (loads) T1 and T2 via an arbitrary voltage controller as schematically illustrated in FIG. 7 and power may be output after the voltage between output terminals is further stepped up. According to this configuration, in the photovoltaic device, it is possible to cope with a voltage request from a load while maintaining the voltage between output terminals of the photovoltaic module at a voltage suitable for operation and maintaining a state in which output power efficiency of the photovoltaic device is good.

Application of Voltage Stabilization Capacitor

Referring to FIGS. 5A to 5C again, in the circuit configuration in which n switching elements are present, particularly, in the configuration in which the switching elements $M_{2m-1}$ which are connected to the chopper circuits of the odd-numbered stages from one of the output terminals, for example, a positive electrode side of the photovoltaic module, may be allocated to the first group, the switching elements $M_{2m}$ which are connected to the chopper circuits of the even-numbered stages may be allocated to the second group, and the states of all the switching elements are alternately switched between phase 1 (Ph1) in which all the switching elements in the first group are switched to the OFF state and all the switching elements in the second group are switched to the ON state and phase 2 (Ph2) in which all the switching elements in the first group are switched to the ON state and all the switching elements in the second group are switched to the OFF state, the switching control of the switching elements is simplified and the parameters to be adjusted at the time of activating the photovoltaic device is only the voltage between output terminals Vout. Accordingly, the time and labor for a series of controls can be much reduced, which is very advantageous. In this configuration, in order to further stabilize the generated voltages of the photovoltaic cells (or the held voltages of the capacitors), voltage stabilization capacitors Cvj (Cv1, Cv2, Cv3, $Cv_{2k-1}$) may be connected to an array of switching element Mj connected in series as illustrated in FIG. 8. These capacitors are hereinafter referred to as "voltage stabilization capacitors" (for the purpose of distinction from the capacitors connected in parallel to the photovoltaic cells).

The "voltage stabilization capacitors" are connected in parallel to both ends of all the groups (a group of the first and second switching elements, a group of the third and fourth switching elements, . . . ) of the (2m−1)-th (where m is an integer from 1 to n/2) switching element and the 2m-th switching element from one end of an array of n switching elements (where n is a positive integer) connected in series, for example, a positive electrode side of the photovoltaic module and are connected in parallel to both ends of all the groups (a group of the second and third switching elements, a group of the fourth and fifth switching elements, . . . ) of the (2i−2)-th (where i is an integer from 2 to n/2) switching element and the (2i−1)-th switching element from the one end. The voltage stabilization capacitors may be capacitors which are generally used in the art.

As described above, in the configuration in which periodic switching between phase 1 and phase 2 in which the switching elements Mj are alternately switched to the OFF state, when the "voltage stabilization capacitors" are not used in the switching element array, the conditions of Equations (4b) and (4c) are more satisfactorily secured due to presence of the voltage stabilization capacitors in a situation in which the conditions of Equations (4b) and (4c) (the conditions in which the generated voltages of the photovoltaic cells (or the held voltages of the capacitors) Vj in the stages in which the switching elements are simultaneously switched to the OFF state are equal to each other) are destabilized depending on accuracy of characteristics of the switching elements or characteristics such as parasitic resistance and impedance (the voltage is not uniformly distributed or the like). Although not illustrated in the drawing, the "voltage stabilization capacitors" can be applied to the configuration in which the photovoltaic module is divided into a plurality of units as illustrated in FIGS. 6A and 6B or the configuration including the voltage controller as illustrated in FIG. 7. It should be understood that these cases also belong to the scope of the disclosure.

In the circuit configuration to which the voltage stabilization capacitors are applied, the generated voltages of the photovoltaic cells (or the held voltages of the capacitors) Vj are specifically determined as follows.

(i) In a case of n=2k (where k is a positive integer), that is, when the number of switching elements in the circuit configuration is an even number, the voltage stabilization capacitors $Cv_1$ to $Cv_{2k-1}$ are connected between the switching element array M1 to M2k every two neighboring switching elements as schematically illustrated in FIG. 8. During activation thereof, the states of the switching elements are alternately, periodically, and repeatedly switched between phase 1 and phase 2 at equal intervals. In phase 1, the odd-numbered switching elements from the positive electrode side of the photovoltaic module are switched to the OFF state (FIG. 9A), and the voltage stabilization capacitors $Cv_1$ to $Cv_{2k-1}$ are connected in series with $Cv_1$ alone and $Cv_2$ to $Cv_{2\_1}$ as pairs between the output terminals ot+ and ot− as illustrated in FIG. 9B to constitute a circuit in which capacitors of k stages are connected in series. In phase 2, the even-numbered switching elements from the positive electrode side of the photovoltaic module are switched to the OFF state (FIG. 9C), and the voltage stabilization capacitors $Cv_1$ to $Cv_{2k-1}$ are connected in series with $Cv_1$ to $CV_{2k-2}$ as pairs and $Cv_{2k-1}$ alone between the output terminals ot+ and ot− as illustrated in FIG. 9D to constitute a circuit in which the capacitors of k stages are connected in series. Then, since the connection states of the voltage stabilization capacitors $Cv_1$ to $Cv_{2k-1}$ illustrated in FIGS. 9B and 9D are repeatedly realized, the voltages $V(Cv_1)$ to $V(Cv_{2k-1})$ of the voltage stabilization capacitors $Cv_1$ to $CV_{2k-1}$ are equal to each other in a steady state in which phase 1 and phase 2 appear alternately. (More specifically, since $V(Cv_2)=V(Cv_3)$, $V(Cv_{2k-2})=V(Cv_{2k-1})$ are satisfied in phase 1 and $V(Cv_2)=V(Cv)$, . . . , $V(Cv_{2k-2})=V(Cv_{2k-3})$ are satisfied in phase 2, $V(Cv_1)=V(Cv_2)=V(Cv_3)=$ . . . $=V(Cv_{2k-2})=V(Cv_{2k-1})$ is satisfied in the steady state.) Since the voltage between the output terminals ot+ and ot− is adjusted to Vout and is held in the series circuit of the voltage stabilization capacitors of k stages, a relationship of $V(Cv_1)=V(Cv_2)$ . . . $(Cv_{2k-1})=$ Vout/k . . . (5a) is satisfied.

Since the voltage Uj held when each switching element is in the OFF state is stably held by the voltage stabilization capacitor Cvj as can be understood from FIGS. 9A and 9C, $Uj=V(Cv_1)=Vout/k$ . . . (5b) [where $U2k=V(Cv_{2k-1})$] is satisfied and the voltage Uj held when each switching element is in the ON state is Uj=0 . . . (5c). Then, regarding the generated voltages of the photovoltaic cells (or the held voltages of the capacitors) Vj, a relationship of $Vj+Lj\cdot\int(dI/dt)=Uj=Vout/k$ . . . (5d) is satisfied (the interval of integration ranges from 0 to D·Ts when j=2m−1, and ranges from D·Ts to Ts when j=2m) when the corresponding switching element Mj is in the OFF state, and a relationship of $Vj+Lj\cdot\int(dI/dt)=Uj=0$ . . . (5e) is satisfied when the corresponding switching element Mj is in the ON state. Since D=½ is satisfied herein, 2 $Vj+Lj\cdot\int(dI/dt)$ [the interval of integration ranges from 0 to Ts]=Vout/k and $Lj\cdot\int(dI/dt)=0$ are satisfied by (5d)+(5e) and thus Vj=Vout/2k . . . (5f) is satisfied. It should be understood that the voltage Uj held when the each switching element is in the OFF state is stably held by the corresponding voltage stabilization capacitor Cvj in the steady state and thus the generated voltages of the photovoltaic cells (or the held voltages of the capacitors) is determined more stably. That is, larger tolerance is allowed in characteristics of the switching elements, which is advantageous.

(ii) In a case of n=2k−1, that is, when the number of switching elements in the circuit configuration is an odd number, the voltage stabilization capacitors $Cv_1$ to $Cv_{2k-2}$ are connected between the switching element array M1 to M2k−1 every two neighboring switching elements as schematically illustrated in FIG. 10A. During activation thereof, a circuit in which capacitors of k stages are connected in series is constituted in phase 1 (FIG. 10B), and a circuit in which capacitors of k−1 stages are connected in series is constituted in phase 2 (FIG. 10C) by the voltage stabilization capacitors $Cv_1$ to $Cv_{2k-2}$. Similarly to the case of (i), the states of the switching elements are alternately, periodically, and repeatedly switched between phase 1 and phase 2 at equal intervals. Accordingly, in the steady state, since the voltages $V(Cv_1)$ to $V(Cv_{2k-2})$ of the voltage stabilization capacitors $Cv_1$ to $CV_{2k-2}$ are expected to be equal to each other and the voltage between the output terminals ot+ and ot− is adjusted to Vout, a relationship of $V(Cv_1)$=V-$(Cv_2)$ ... $-V(Cv_{2k-2})$=Vout/(k−½) ... (6a) is satisfied as a result. Similarly, the voltage Uj held when each switching element is in the OFF state is Uj=$V(Cv_j)$=Vout/(k−½) ... (6b), and the voltage Uj when each switching element is in the ON state is Uj=0 ... (6c). The generated voltage Vj of the photovoltaic cell (or the generated voltages of the photovoltaic cells (or the held voltages of the capacitors) as for the capacitors because the ON/OFF states appear uniformly and alternately in phase 1 and phase 2) corresponding to each switching element Mj is Vj=Vout/(2k−1) ... (6d).

In the case of n=2k−1, when switching between phase 1 and phase 2 is not sufficiently fast, Equation (6a) may not be satisfied and the generated voltages of the photovoltaic cells (or the held voltages of the capacitors) Vj may not be equal to each other. On the other hand, in the case of n=2k, the condition of Equation (5a) is stably satisfied and the generated voltages of the photovoltaic cells (or the held voltages of the capacitors) Vj stably satisfies the condition of Equation (5f). Accordingly, in this embodiment, the photovoltaic operating point control circuit is constituted such that the number of step-up/down chopper circuits is an even number. For example, when the number of photovoltaic cells connected in series is an odd number, a chopper circuit (a capacitor, an inductor, and a switching element) may be added and a circuit may be constituted such that the number of stages is an even number. When a chopper circuit part is added to step up the output voltage across both ends of the photovoltaic module and the number of stages of the chopper circuits is an odd number, a chopper circuit may be added and a circuit may be constituted such that the total number of stages is an even number.

Decrease in Power Output Loss in Switching Element

In the photovoltaic operating point control circuit according to this embodiment, in the configuration in which periodic switching between phase 1 and phase 2 in which the switching elements Mj of the switching element array are alternately switched to the OFF state is performed, the generated voltages of the photovoltaic cells (or the held voltages of the capacitors) Vj is stabilized when the number of stages of the step-up/down chopper circuit is an even number. Accordingly, in some embodiments a chopper circuit which is not connected to a photovoltaic cell is added to make the number of stages be an even number when the number of stages of the step-up/down chopper circuit is an odd number. In this regard, when a switching element of a chopper circuit which is not connected to a photovoltaic cell is in the ON state, the whole current passing through the chopper circuit part flows through the switching element. For example, as illustrated in FIG. 11A, when the chopper circuit (C2*k*, M2*k*, and L2*k*−1) which is not connected to a photovoltaic cell is added between the output terminals ot+ and ot− and the switching element M2*k* is in the ON state, substantially the whole current Tout flowing between the output terminals passes through the switching element M2*k*. In this case, since the switching element has significant parasitic resistance, a power output loss due to the resistance occurs by the current Iout passing through the switching element M2*k*.

Therefore, in the photovoltaic operating point control circuit according to this embodiment, when a chopper circuit which is not connected to a photovoltaic cell is added, in some embodiments the circuit part is added to the outside of the output terminals ot+ and ot− as illustrated in FIG. 11B. According to this configuration, the current Iout flowing between the output terminals does not flow substantially in the added switching element M2*k* and the power output loss can be avoided by as much, which is advantageous.

The chopper circuit part added to the outside of the output terminals ot+ and ot− may be constituted in various aspects. For example, when the output terminals ot+ and ot− connected to a load are formed at both ends of the photovoltaic module, the added chopper circuit part may be disposed on a negative electrode side of the photovoltaic module as illustrated in FIG. 11B, may be disposed on a positive electrode side of the photovoltaic module as illustrated in FIG. 12A, or may be disposed on both electrode sides of the photovoltaic module as illustrated in FIG. 12B. When a chopper circuit (C3, M3, and L2) which is not connected to a photovoltaic cell and which is used to step up the output voltage of the photovoltaic module has been already added between the output terminals ot+ and ot− as illustrated in FIG. 12C, a chopper circuit part (C4, M4, and L3) may be added to the outside of the output terminals ot+ and ot−.

Omission of Inductor in Operating Point Control Circuit

In a series of configurations of the photovoltaic device and/or the photovoltaic operating point control circuit according to this embodiment, the electrode connection terminal ct of each photovoltaic cell PVj or both terminals of each capacitor Cj are connected to the corresponding switching element Mj via the inductor Lj. This inductor Lj is a part of the step-up/down chopper circuit and performs a function of generating a counter electromotive force with respect to a variation in current at the time of switching the state of the switching element Mj between the ON/OFF states in cooperation with the corresponding capacitor Cj and the corresponding switching element Mj. In this regard, at least one inductor for generating the counter electromotive force has only to be interposed between the switching element Mj in the OFF state and the corresponding capacitor Cj, but may not be disposed on both sides of the switching element Mj. That is, plainly speaking, in the configuration including a multistage step-up/down chopper circuit according to this embodiment, when the inductor is disposed every other stage instead of all the stages, the circuit operates normally. Since the inductor has higher parasitic resistance than that of a normal wire (for example, a straight copper wire), the power output loss due to the resistance increases as the number of inductors increases. Accordingly, the inductors (L2, L4, $L_{2k-2}$, the inductors of which reference signs are described in parentheses in FIGS. 8 to 13) which are connected between a connection point between the (2i−2)-th (where i is an integer from 2 to n/2) switching element and the (2i−1)-th switching element from one of the output terminals, for example, the positive electrode side of the photovoltaic module and a connection point between the capacitors corresponding to the switching elements may be replaced with normal wires. Accordingly, it is possible to further decrease a power output loss in the circuit. When the inductors L2, L4, ..., $L_{2k-2}$, are omitted and short-circuited and the inductors L1, L3, ... are left, it is advantageous in efficiency that no inductor is disposed between both ends of the photovoltaic module and the output terminals. In this case, the inductors L1, L3, ... are necessary (in other words, the inductor needs to be disposed every other stage from the output terminals).

Application of Photovoltaic Operating Point Control Circuit to Other Power Supply Elements The above-mentioned series of configurations of the photovoltaic device and/or the photovoltaic operating point control circuit according to this embodiment may be applied when arbitrary power supply cells such as chemical cells, capacitor cells, fuel cells (which may be solid oxide fuel cells), thermoelectric generation elements, and generator cells (arbitrary generators using wind power, water power, tidal power, an engine, or the like) are connected in series in addition to the photovoltaic cells as illustrated in FIG. 13. When the optimal operating voltages of the power supply cells connected in series are different from each other but a power decrease due to the difference in the operating voltage is not great, it is possible to reduce the time and labor for adjusting the operating voltages without much reducing the output power by uniformly fixing the duty ratios and using the operating point control circuit device in accordance with teaching of the disclosure. The configuration of the photovoltaic operating point control circuit according to the disclosure may be applied when the types of the power supply cells connected in series are either equal to or different from each other. For example, in the operating point control circuit device having the circuit configuration according to the disclosure as illustrated in FIGS. 2A, 2B, 6A, 6B, 7, and 8, arbitrary power supply cells such as chemical cells, capacitor cells, fuel cells, thermoelectric generation elements, and generator cells may be connected in series instead of the photovoltaic cells, or different types of power supply cells may be connected in series for use as illustrated in FIG. 13.

While embodiments of the disclosure have been described above, the disclosure can be easily modified in various forms by those skilled in the art. The disclosure is not limited to the embodiments, but can be applied to various types of devices without departing from the concept of the disclosure.

What is claimed is:

1. A photovoltaic device comprising:
a plurality of photovoltaic cells which are connected in series between output terminals or a plurality of photovoltaic cells and capacitors, wherein the photovoltaic cells are connected in series between output terminals, the capacitors are connected in series between output terminals, and the photovoltaic cells and the capacitors are connected in parallel;
a photovoltaic operating point control circuit device including an inductor and a switching element that are connected in parallel to each photovoltaic cell or each photovoltaic cell and capacitor which are connected in parallel, wherein the inductor and the switching element are connected in series, the photovoltaic operating point control circuit device being configured to output a current from the corresponding photovoltaic cell or capacitor to between the output terminals by periodically cutting off the switching elements,
wherein the photovoltaic operating point control circuit device fixes cutoff duty ratios of all switching elements in one cycle in which the switching elements corresponding to all the plurality of photovoltaic cells or the plurality of photovoltaic cells and capacitors which are connected in series are cut off once,
wherein a sum of cutoff durations of all the switching elements in one cycle is larger than a duration of one cycle, and
wherein a part of the cutoff times overlap in the neighboring cutoff times.

2. The photovoltaic device according to claim 1, wherein a certain plurality of cutoff times among the cutoff times of all the switching elements in one cycle are the same.

3. The photovoltaic device according to claim 1, wherein the plurality of photovoltaic cells or the plurality of photovoltaic cells and capacitors are grouped into a plurality of units, and
the photovoltaic operating point control circuit device is provided for each of the plurality of units and controls cutoff of the switching elements belonging to the corresponding unit.

4. The photovoltaic device according to claim 1, wherein the plurality of photovoltaic cells or the plurality of photovoltaic cells and capacitors are grouped into a plurality of units sharing one boundary therebetween, and
the photovoltaic operating point control circuit device is provided for each of the plurality of units and controls cutoff of the switching elements belonging to the corresponding unit.

5. The photovoltaic device according to claim 1, wherein the plurality of photovoltaic cells or the plurality of photovoltaic cells and capacitors are connected in series via a voltage controller between the output terminals.

6. An operating point control circuit device for a plurality of power supply cells which are connected in series, comprising:
a pair of output terminals;
a plurality of electrode connection terminals that are connected to electrode terminals of the plurality of power supply cells connected in series between the pair of output terminals;
a capacitor that is connected in parallel to each of the plurality of power supply cells via the corresponding electrode connection terminal between the pair of output terminals;
a switching element and an inductor that are connected in parallel to each of the plurality of power supply cells via the corresponding electrode connection terminal between the pair of output terminals and that selectively connects a pair of electrode connection terminals connected to each other, wherein the switching element and the inductor are connected in series; and
a controller that alternately switches a state of each switching element between a connected state in which a pair of electrode connection terminals or terminals of a pair of capacitors are connected and a cut-off state in which a connection of both terminals is cut off in the same predetermined period,
wherein the controller normally performs control such that at least a part of the switching elements are in the cut-off state and the other switching elements are in the connected state, and
ratios of a duration of the cut-off state to the predetermined period in all the switching elements are uniformly fixed to the same value.

7. The operating point control circuit device according to claim 6, further comprising:
an additional capacitor that is connected in series to the corresponding capacitor between the electrode connection terminal at one end of the plurality of power supply cells connected in series and one of the output terminals or between two electrode connection terminals of two neighboring power supply cells among the plurality of power supply cells connected in series between the pair of output terminals; and an additional switching element that is connected in parallel to the additional capacitor and in series to the switching element.

8. The operating point control circuit device according to claim 6, further comprising:
an additional capacitor that is connected in series to the capacitors connected in series between the pair of output terminals; and
an additional switching element that is connected in parallel to the additional capacitor and in series to the switching elements connected in series between the pair of output terminals.

9. The operating point control circuit device according to claim 6, wherein
the controller controls states of the switching elements such that times at which all the switching elements are switched to the cut-off state are different from each other.

10. The operating point control circuit device according to claim 6, wherein
the controller controls states of the switching elements such that the switching elements which are switched to the cut-off state at one time are two neighboring switching elements.

11. The operating point control circuit device according to claim 6, wherein
the controller controls states of the switching elements such that:
the switching elements which are switched to the cut-off state at one time among the switching elements are two neighboring switching elements; and
the switching element switched to the cut-off state sequentially shifts one at a time from one end of an array of the switching elements connected in series to the other end.

12. The operating point control circuit device according to claim 6, wherein
the controller alternately switches states of the switching elements connected in series between a first phase in which all the switching elements which are odd-numbered from one end of an array of the switching elements connected in series are in the cut-off state and all the switching elements which are even-numbered from the one end of the array of the switching elements are in the connected state and a second phase in which the switching elements which are odd-numbered from the one end of the array of the switching elements are in the connected state and the switching elements which are even-numbered from the one end of the array of the switching elements are in the cut-off state.

13. The operating point control circuit device according to claim 12, wherein
when n is a positive integer and m is an integer from 1 to n/2, a voltage stabilization capacitor is connected in parallel to both ends of each set of the switching elements which are (2m−1)-th and 2m-th disposed from one end of an array of n switching elements connected in series, and
when i is an integer from 2 to n/2, a voltage stabilization capacitor is connected in parallel to both ends of each set of the switching elements which are (2i−2)-th and (2i−1)-th disposed from the one end.

14. The operating point control circuit device according to claim 6, wherein
the plurality of switching elements are grouped into a plurality of groups and states of the switching elements belonging to each group are controlled independently for each group.

15. The operating point control circuit device according to claim 14, wherein
at least one power supply cell is connected in parallel to both of one switching element of a first group and one switching element of a second group between the pair of output terminals.

16. The operating point control circuit device according to claim 6, wherein
the pair of output terminals are connected to an output voltage controller that controls an output voltage between the output terminals.

17. The operating point control circuit device according to claim 6, wherein
when n is a positive integer and m is an integer from 1 to n/2, a connection point between the switching elements which are (2m−1)-th and 2m-th disposed from one end of an array of n switching elements connected in series and a connection point between the capacitors corresponding to the switching elements are connected via the inductor, and
when i is an integer from 2 to n/2, a connection point between the switching elements which are (2i−2)-th and (2i−1)-th disposed from the one end and a connection point between the capacitors corresponding to the switching elements are connected without the inductor interposed therebetween.

18. The operating point control circuit device according to claim 6, wherein
the power supply cells are photovoltaic cells, chemical cells, fuel cells, capacitor cells, generator cells, thermoelectric elements, or combinations thereof.

* * * * *

UNITED STATES PATENT AND TRADEMARK OFFICE
CERTIFICATE OF CORRECTION

PATENT NO. : 10,483,763 B2  
APPLICATION NO. : 15/674226  
DATED : November 19, 2019  
INVENTOR(S) : Shinichi Urabe and Toshihisa Shimizu Page 1 of 1

It is certified that error appears in the above-identified patent and that said Letters Patent is hereby corrected as shown below:

On the Title Page

Item (72), Inventors, delete "Toshihisa Shimizu, Fuchu (JP)" and insert --Toshihisa Shimizu, Fuchu-shi, Tokyo (JP)--, therefor.

In the Specification

In Column 22, Line 23 & 24, delete "$V(C_{v_2})=V(C_{v_3}), V(C_{v_{2k-2}})=V(C_{v_{2k-1}})$" and insert --$V(C_{v_2})=V(C_{v_3}), ..., V(C_{v_{2k-2}})=V(C_{v_{2k-1}})$--, therefor.

Signed and Sealed this  
Fourth Day of February, 2020

Andrei Iancu  
*Director of the United States Patent and Trademark Office*